United States Patent
Goto

(10) Patent No.: US 10,416,262 B2
(45) Date of Patent: Sep. 17, 2019

(54) APPARATUS AND METHOD FOR DETECTING POSITION OF A PART IN MAGNETIC RESONANCE IMAGING

(71) Applicant: General Electric Company, Schenectady, NY (US)

(72) Inventor: Takao Goto, Hino (JP)

(73) Assignee: General Electric Company, Schenectady, NY (US)

( * ) Notice: Subject to any disclaimer, the term of this patent is extended or adjusted under 35 U.S.C. 154(b) by 189 days.

(21) Appl. No.: 15/510,620

(22) PCT Filed: Sep. 9, 2015

(86) PCT No.: PCT/US2015/049072
§ 371 (c)(1),
(2) Date: Mar. 10, 2017

(87) PCT Pub. No.: WO2016/040411
PCT Pub. Date: Mar. 17, 2016

(65) Prior Publication Data
US 2017/0199260 A1 Jul. 13, 2017

(30) Foreign Application Priority Data
Sep. 12, 2014 (JP) .................................. 2014-186886

(51) Int. Cl.
*G01R 33/56* (2006.01)
*G01R 33/565* (2006.01)
(Continued)

(52) U.S. Cl.
CPC ... *G01R 33/5608* (2013.01); *G01R 33/56509* (2013.01); *G06T 7/11* (2017.01);
(Continued)

(58) Field of Classification Search
CPC .......... G01R 33/5608; G01R 33/56509; G06T 7/136; G06T 7/11; G06T 2207/30056; G06T 2207/10088
See application file for complete search history.

(56) References Cited

U.S. PATENT DOCUMENTS

2013/0197370 A1   8/2013  Burlina et al.
2014/0002079 A1   1/2014  Goto

FOREIGN PATENT DOCUMENTS

JP   2006051170 A  *  2/2006
JP   2011216069 A     10/2011
(Continued)

OTHER PUBLICATIONS

International Search Report and Written Opinion for International Application No. PCT/US2015/049072, dated Dec. 9, 2015, 14 pages.
(Continued)

*Primary Examiner* — Susan S Lee

(57) ABSTRACT

The MR apparatus 100 comprises: image producing unit 9a for producing coronal images of a part to be imaged; search-region defining unit 9d for defining a region Rs1 to be searched; unit for determining an indicator VI representing a likelihood that a pixel contained in the region Rs1 to be searched lies on an edge E of a liver adjacent to lungs; and unit for, by dividing the region Rs1 to be searched into a plurality of sub-regions R1-R11 arranged in an SI-direction, determining a position of the edge E of the liver in the SI-direction based on indicators VI obtained on a sub-region-by-sub-region basis.

15 Claims, 33 Drawing Sheets

(51) Int. Cl.
 G06T 7/11 (2017.01)
 G06T 7/136 (2017.01)
(52) U.S. Cl.
 CPC .... *G06T 7/136* (2017.01); *G06T 2207/10088* (2013.01); *G06T 2207/30056* (2013.01)

(56) References Cited

FOREIGN PATENT DOCUMENTS

| | | | |
|---|---|---|---|
| JP | 2011245205 A | 12/2011 | |
| JP | 2013208208 A | 10/2013 | |
| JP | 2014008245 A | 1/2014 | |
| JP | 2014108164 A | 6/2014 | |
| WO | 2014/085027 A1 | 6/2014 | |

OTHER PUBLICATIONS

Goto, T. et al. : "Automated Navigator Tracker positioning for MRI liver scans", Proceedigns of the Internation Society for Magnetic Resonance in Medicine, 20th Annual Meeting & Exhibition, May 5, 2012 (May 5, 2012), p. 3402, XP040625824, Melbourne, Australia. the whole document.

* cited by examiner

FIG.32
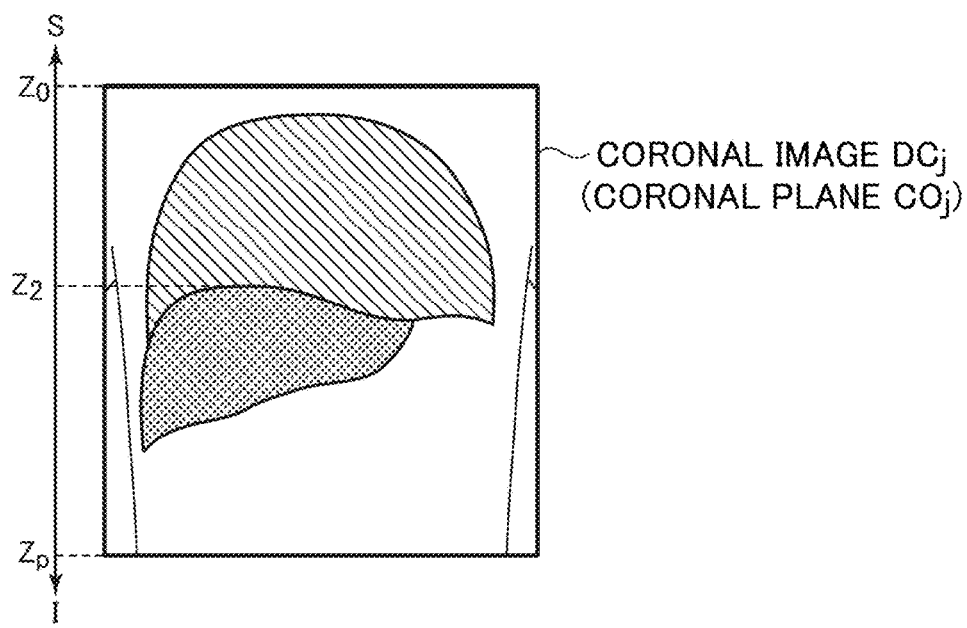
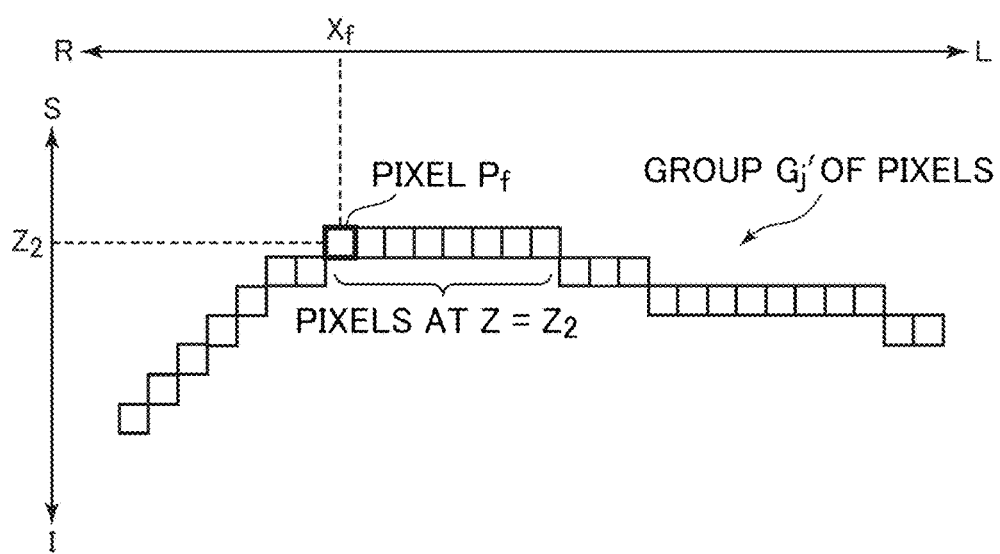

APPARATUS AND METHOD FOR DETECTING POSITION OF A PART IN MAGNETIC RESONANCE IMAGING

CROSS-REFERENCE TO RELATED APPLICATIONS

This is a national stage application under 35 U.S.C. § 371 (c) of PCT Patent Application No. PCT/US2015/049072, filed on Sep. 9, 2015, which claims priority to Japan Patent Application No. 2014-186886, filed on Sep. 12, 2014, the disclosures of which are incorporated herein by reference in their entireties.

BACKGROUND

The present invention relates to a magnetic resonance apparatus for scanning a part to be imaged, and a program applied to the magnetic resonance apparatus.

One method for detecting an uppermost end of a liver involves binarizing a coronal image including the liver and lungs. Since the lungs contain the air, they generally tend to yield lower-intensity signals than the liver. Therefore, a threshold for binarizing the coronal image so that tissue with low-intensity signals has a value of zero and that with high-intensity signals has a value of one is prepared, and the threshold is used to binarize the coronal image, whereby a binary image may be produced in which the lungs have a value of zero and the liver has a value of one. Since the lungs are zero and the liver is one in the binary image thus produced, the position at which the pixel value changes from zero to one may be detected to thereby find an uppermost end of the liver.

However, it is difficult in practice to define an optimal value of the threshold for assigning zero to the lungs and one to the liver, and part of pixels within the region of the lungs may be sometimes assigned with a value of one. Thus, there is a problem that an error in detecting the position of the uppermost end of the liver is increased in case that part of pixels in the region of the lungs are assigned with one, which makes it difficult to distinguish between the lungs and liver.

Therefore, there is a need for a technique with which an error in detecting the position of a part to be detected (for example, an uppermost end of the liver) may be minimized as much as possible.

SUMMARY

The present invention in its first aspect is a magnetic resonance apparatus comprising: an image producing unit for producing first images of a part to be imaged including a first part; a search-region defining unit for defining a first region to be searched including said first part; an unit for determining, based on pixel values of a plurality of pixels contained in said first image, an indicator representing a likelihood that one of said plurality of pixels included in said first region to be searched lies in said first part; and a detecting unit for, by dividing said first region to be searched into a plurality of sub-regions arranged in a first direction intersecting said first part, detecting a position of said first part in said first direction based on said indicators obtained on a sub-region-by-sub-region basis.

The present invention in its second aspect is a program applied to a magnetic resonance apparatus for scanning a part to be imaged including a first part, said program being for causing a computer to execute an image producing processing of producing first images of said part to be imaged; an search-region defining processing of defining a first region to be searched including said first part; processing of determining, based on pixel values of a plurality of pixels contained in said first image, an indicator representing a likelihood that one of said plurality of pixels included in said first region to be searched lies in said first part; and detecting processing of, by dividing said first region to be searched into a plurality of sub-regions arranged in a first direction intersecting said first part, detecting a position of said first part in said first direction based on said indicators obtained on a sub-region-by-sub-region basis.

An indicator representing a likelihood that a pixel lies in a first part is determined, and a position of the first part is determined based on the indicators. Therefore, the position of the first part may be determined without binarizing an image using a threshold, so that precision of detection of the position of the first part may be improved.

BRIEF DESCRIPTION OF DRAWINGS

FIG. 32 is a diagram showing a group Gj' of pixels including pixels at z=z2.

DETAILED DESCRIPTION

Figure 1:
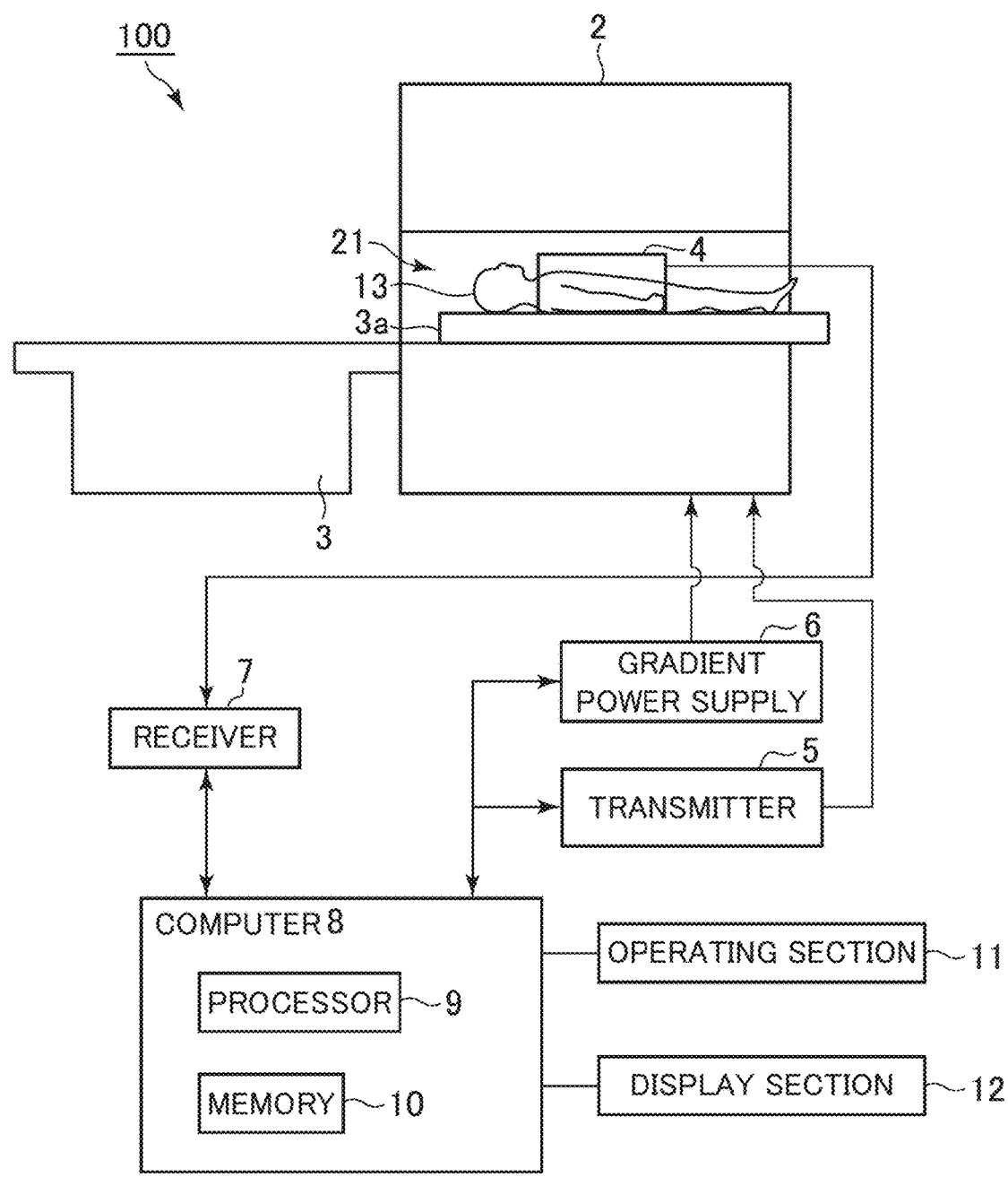
FIG. 1 is a schematic diagram of a magnetic resonance apparatus in one embodiment of the present invention.

Now an embodiment for practicing the invention will be described hereinbelow, although an embodiment of the present invention is not limited thereto. FIG. 1 is a schematic diagram of a magnetic resonance apparatus in one embodiment of the present invention. A magnetic resonance apparatus (referred to hereinbelow as "MR apparatus") 100 comprises a magnet 2, a table 3, and an RF receive coil (referred to hereinbelow as "receive coil") 4, and the like.

The magnet 2 has therein a bore 21 through which a subject 13 is inserted. The magnet 2 comprises a superconductive coil for generating a static magnetic field, a gradient coil for applying a gradient magnetic field, and an RF coil for transmitting RF pulses. A permanent magnet may be used in place of the superconductive coil.

The table 3 has a cradle 3a. The cradle 3a is configured to be movable into the bore 21. The subject 13 is carried into the bore 21 by the cradle 3a.

The receive coil 4 is attached to an abdomen of the subject 13. The receive coil 4 receives magnetic resonance signals from the subject 13.

The MR apparatus 100 further comprises a transmitter 5, a gradient power supply 6, a receiver 7, a computer 8, an operating section 11, and a display section 12.

The transmitter 5 supplies electric current to the RF coil, and the gradient power supply 6 supplies electric current to the gradient coil. The receiver 7 applies signal processing such as modulation/detection to signals received from the receive coil 4.

The computer 8 controls operation of several sections in the MR apparatus 100 to implement several kinds of operation of the MR apparatus 100, such as an operation of transmitting required information to the display section 12, and an operation of reconstructing images. The computer 8 comprises a processor 9 and a memory 10.

Figure 2:
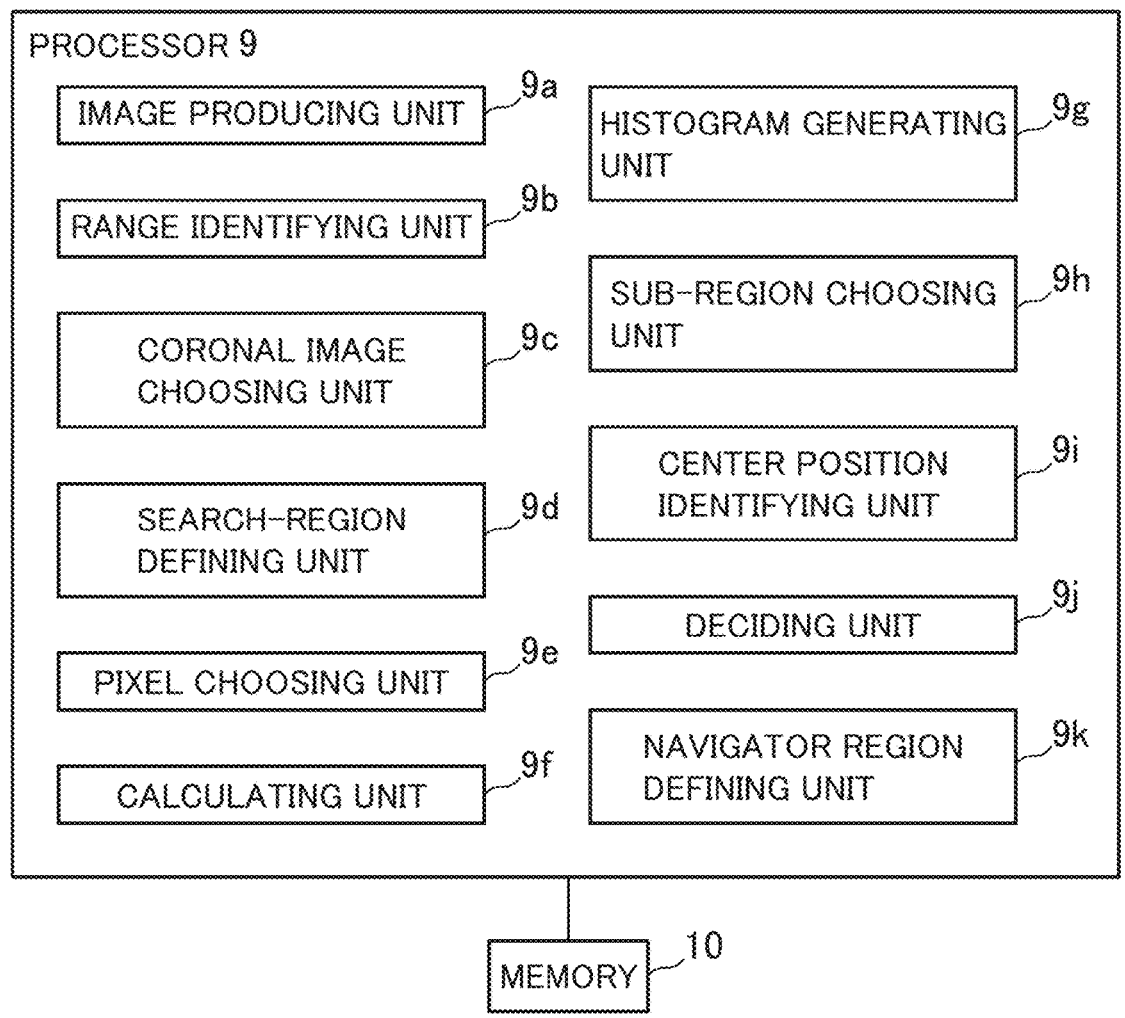
FIG. 2 is a diagram showing processing a processor 9 executes.

FIG. 2 shows processing the processor 9 executes. The memory 10 stores therein programs to be executed by the processor 9. The processor 9 loads a program stored in the memory 10 and executes processing written in the program. The processor 9 loads the programs stored in the memory 10 to thereby configure image producing unit 9a—navigator region defining unit 9k, etc.

Image producing unit 9a produces MR images (coronal images, axial images, etc.) of a part to be imaged. Range identifying unit 9b identifies ranges of an inner region of the subject's body in RL- and AP-directions. Coronal image choosing unit 9c chooses coronal images passing through a liver from among a plurality of coronal images. Search-region defining unit 9d defines a region Rs1 to be searched (see FIG. 14) and a region Rs2 to be searched (see FIG. 24). Pixel choosing unit 9e chooses pixels likely to lie on an edge of the liver from within the region Rs1 to be searched (and region Rs2 to be searched). Calculating unit 9f calculates an indicator VI representing a likelihood that a pixel lies on the edge of the liver. The method of calculating the indicator VI will be discussed later. Histogram generating unit 9g generates a histogram of the indicator VI. Sub-region choosing unit 9h chooses one of a plurality of sub-regions R1-R11 that includes the edge of the liver, which will be discussed later. Center position identifying unit 9i identifies a center position of the sub-region in the SI-direction chosen by the sub-region choosing unit 9h. Deciding unit 9j decides whether a pixel chosen from within the region Rs2 to be searched lies on the edge of the liver or not. Navigator region defining unit 9k defines a navigator region $R_{nav}$ (see FIG. 4).

The processor 9 is an example for configuring the image producing unit 9a—navigator region defining unit 9k, and it functions as these units by executing the programs stored in the memory 10. The calculating unit 9f represents the unit for determining an indicator. A combination of the histogram generating unit 9g, sub-region choosing unit 9h, and center position identifying unit 9i represents the detecting unit.

The operating section 11 is operated by an operator for inputting several kinds of information to the computer 8. The display section 12 displays several kinds of information. The MR apparatus 100 is configured as described above.

Figure 3:
FIG. 3 is a diagram showing scans executed in the present embodiment.
Figure 4:
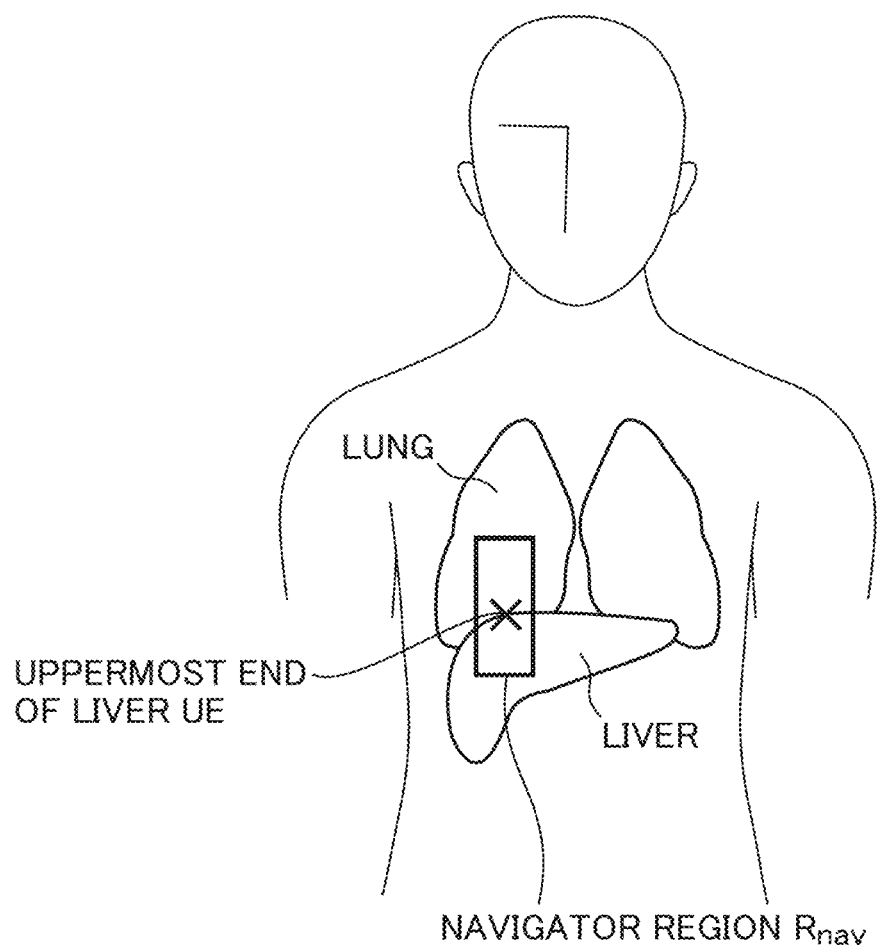
FIG. 4 is a diagram schematically showing a part to be imaged.

FIG. 3 is a diagram showing scans executed in the present embodiment, and FIG. 4 is a diagram schematically showing a part to be imaged. a. In the present embodiment, a localizer scan LS, a main scan MS, etc. are executed.

The localizer scan LS is for obtaining an image for use in defining the navigator region $R_{nav}$ (see FIG. 4) and/or slices (not shown). The navigator region $R_{nav}$ is defined for detecting motion of an uppermost end UE of the liver.

In the main scan MS are performed a navigator sequence for detecting motion of the uppermost end UE of the liver from the navigator region $R_{nav}$ and an imaging scan for acquiring imaging data for a part including the liver. Now flow in executing the localizer scan LS and main scan MS will be described.

Figure 5:
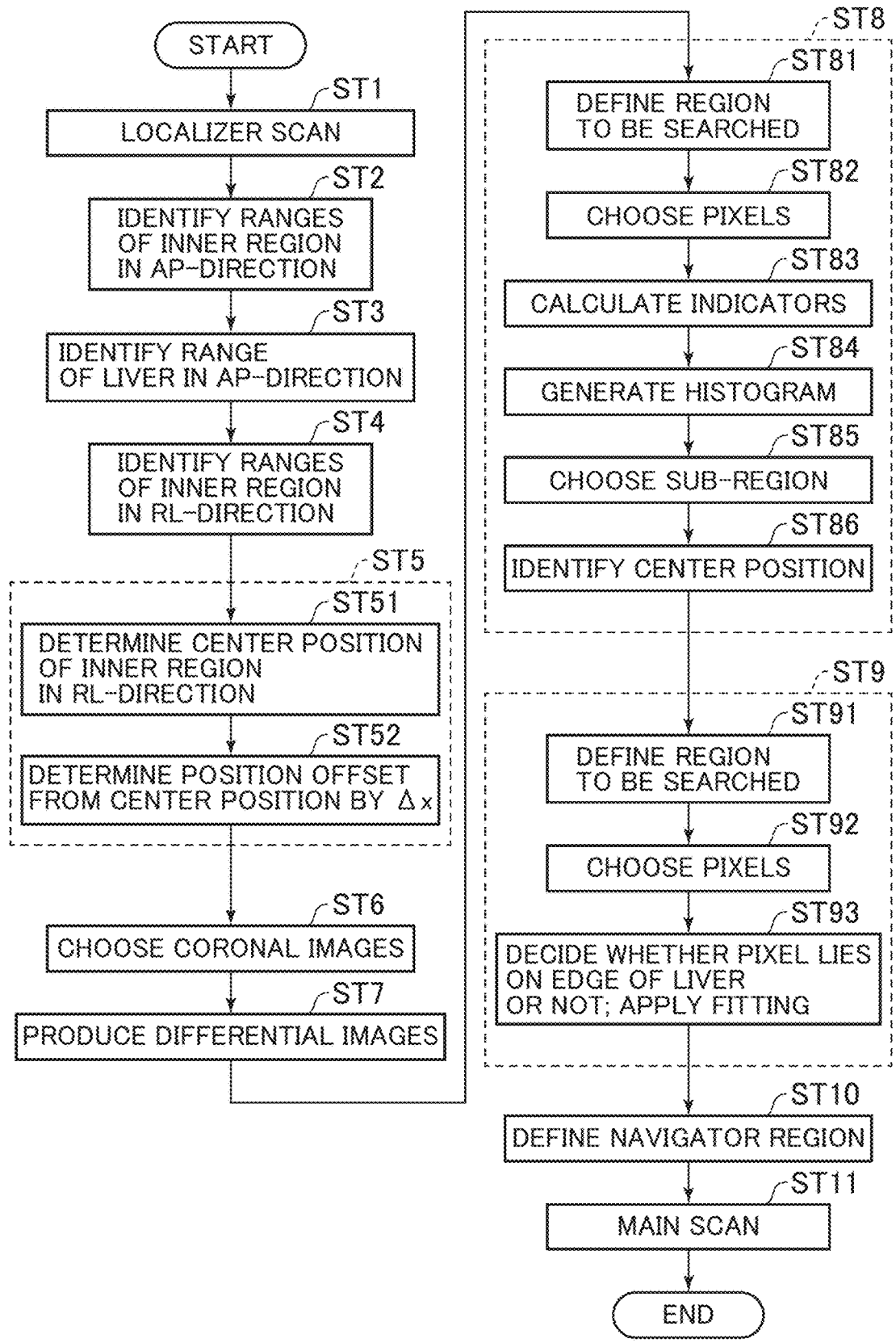
FIG. 5 is a chart showing flow in imaging a subject in the present embodiment.

FIG. 5 is a chart showing flow in imaging the subject in the present embodiment. At Step ST1, a localizer scan LS (see FIG. 3) is executed.

Figure 6:
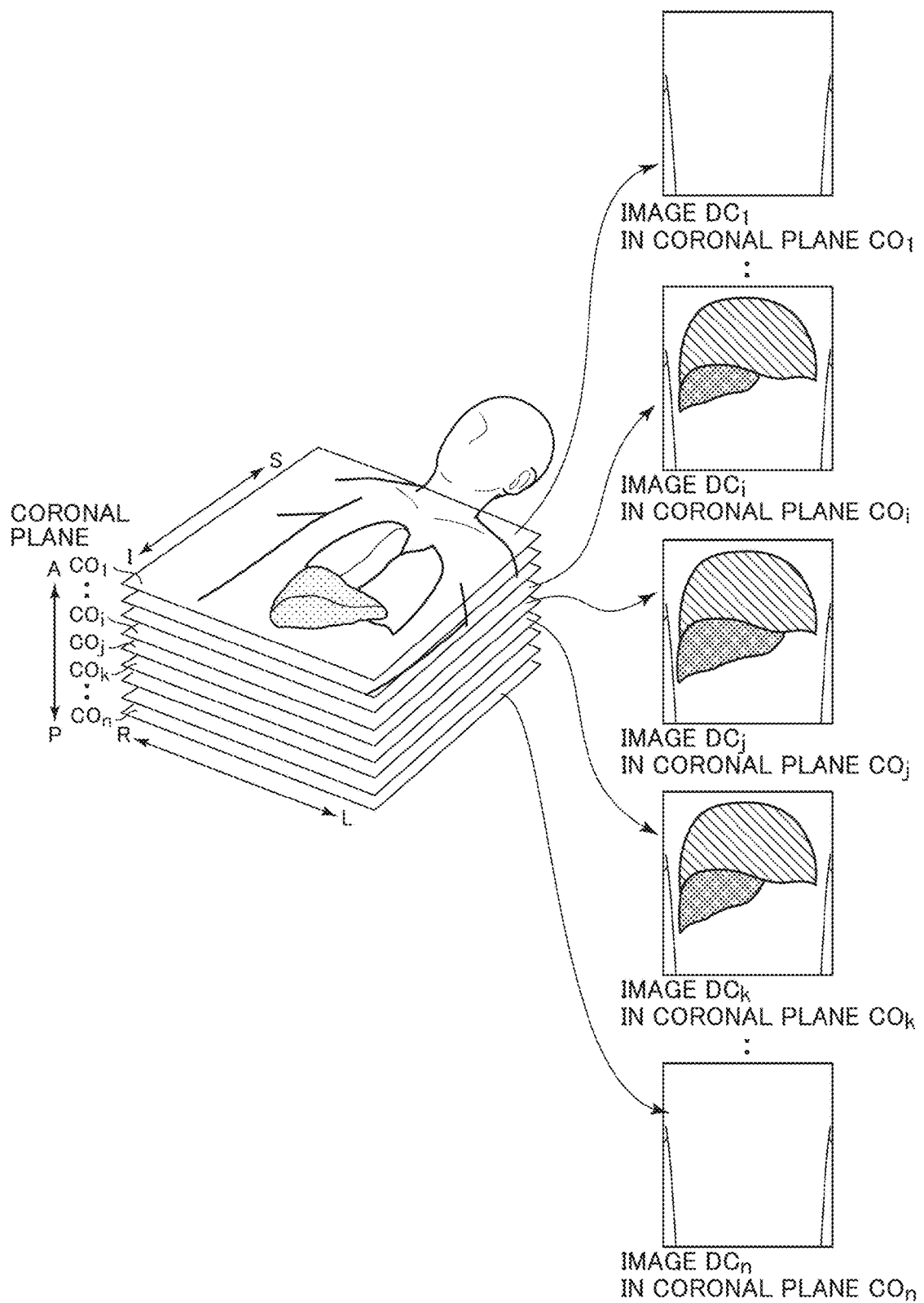
FIG. 6 is a diagram explaining a scan on coronal planes $CO_1$-$CO_n$.
Figure 7:
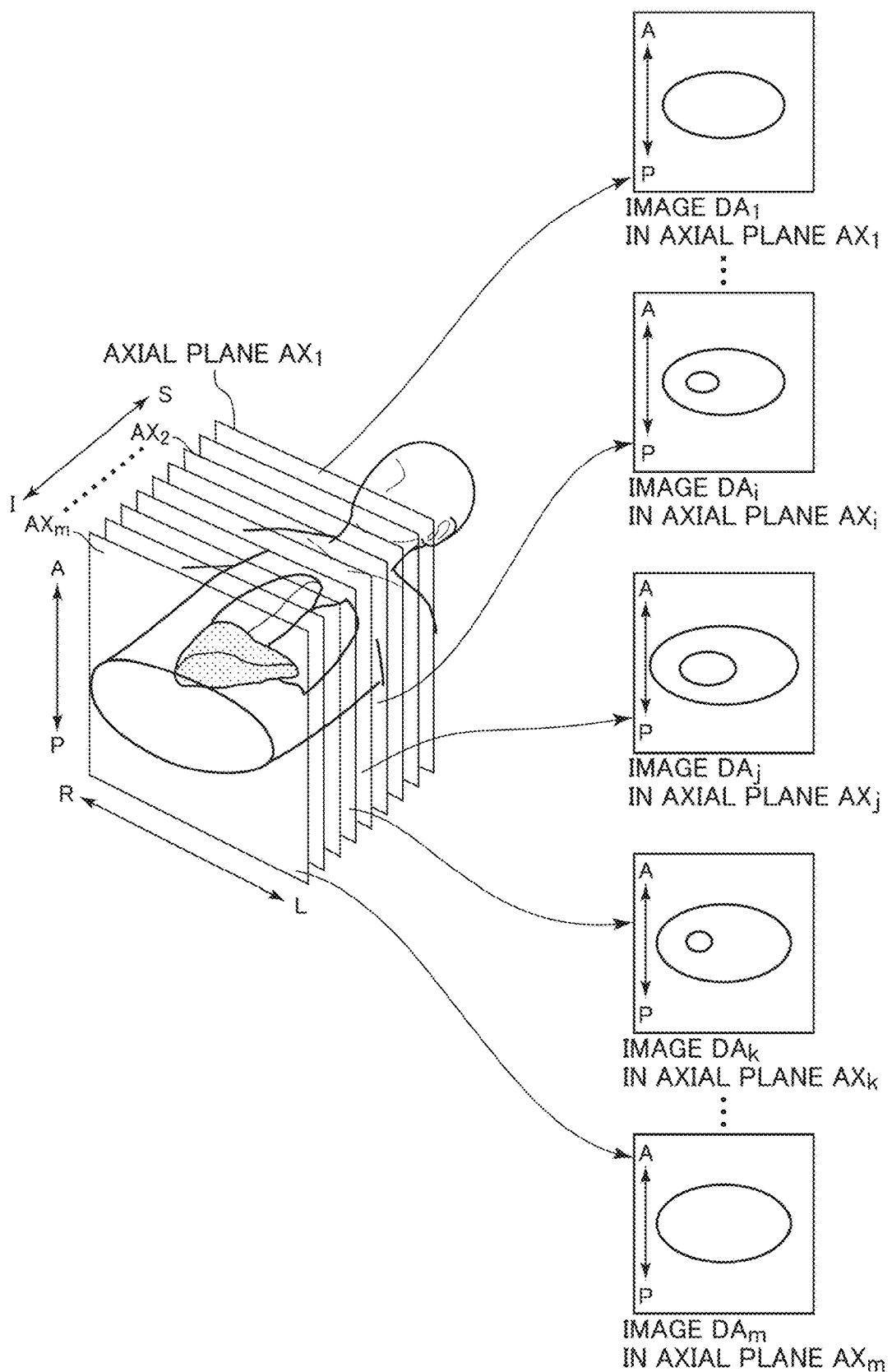
FIG. 7 is a diagram explaining a scan on axial planes $AX_1$-$AX_m$.

FIGS. 6 and 7 are diagrams explaining the localizer scan LS. In the localizer scan LS are executed a scan (see FIG. 6) on a plurality of coronal planes $CO_1$-$CO_n$ passing through a part to be imaged including the liver and a scan (see FIG. 7) on a plurality of axial planes $AX_1$-$AX_m$ passing through the part to be imaged including the liver. The image producing unit 9a (see FIG. 2) produces images $DC_1$-$DC_n$ in the coronal planes $CO_1$-$CO_n$ and images $DA_1$-$DA_m$ in the axial planes $AX_1$-$AX_m$ based on data acquired by the localizer scan LS. An image in the coronal plane will be referred to hereinbelow as "coronal image", and that in the axial plane as "axial image." After producing the coronal images $DC_1$-$DC_n$ and axial images $DA_1$-$DA_m$, the flow goes to Step ST2.

Figure 8:
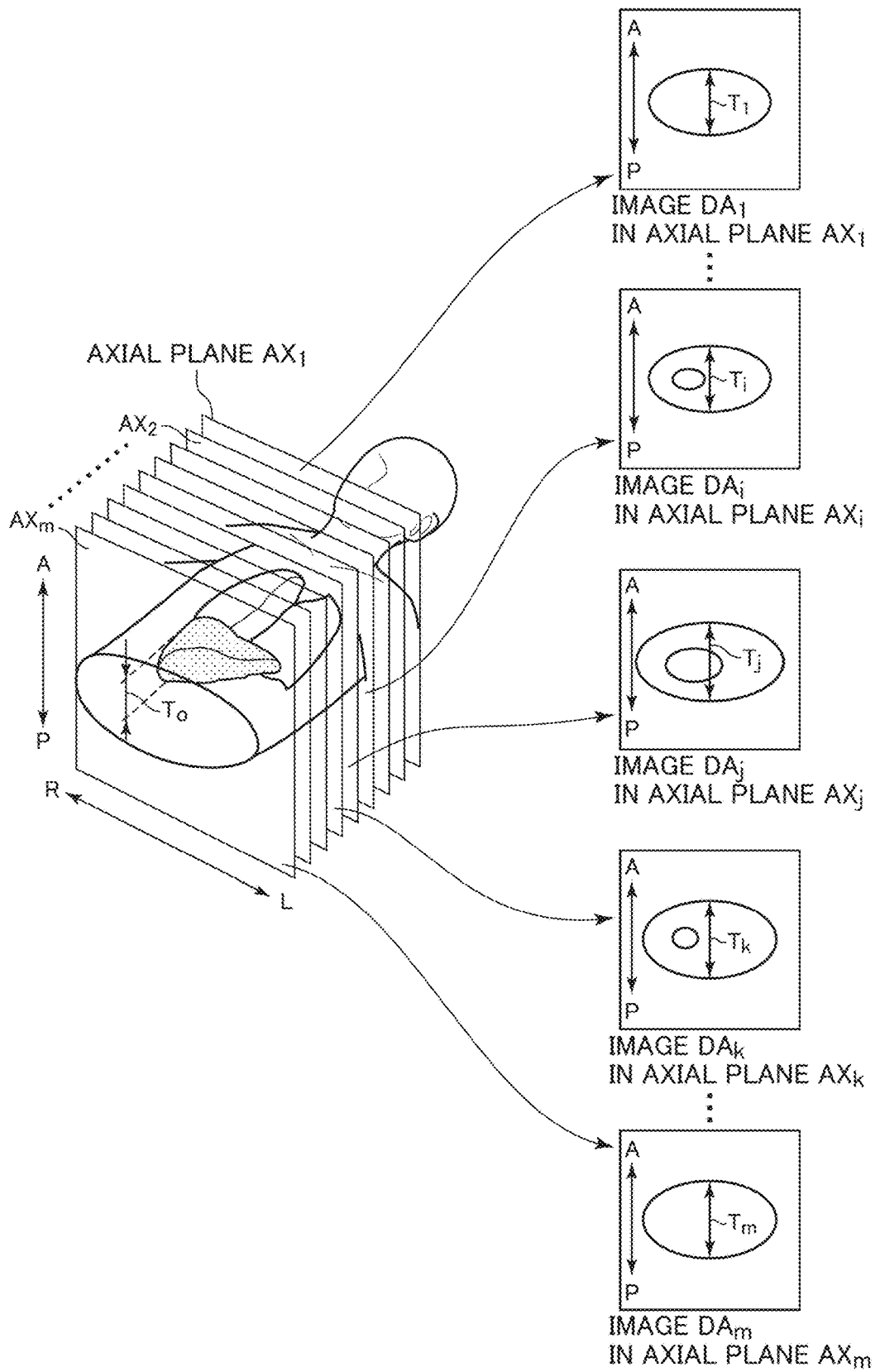
FIG. 8 is a diagram schematically showing ranges $T_1$-$T_m$ of an inner region of the subject's body in an AP-direction.

At Step ST2, the range identifying unit 9b (see FIG. 2) identifies ranges $T_1$-$T_m$ of an inner region of the subject's body in the AP-direction respectively in the axial planes $AX_1$-$AX_m$. FIG. 8 schematically shows the ranges $T_1$-$T_m$ of the inner region of the subject's body in the AP-direction determined respectively for the axial planes $AX_1$-$AX_m$. Since a region outside of the subject's body yields low-intensity signals while the inner region of the subject's body yields high-intensity signals, the ranges $T_1$-$T_m$ of the inner region of the subject's body in the AP-direction may be determined respectively for the axial planes $AX_1$-$AX_m$ from the difference in signal value. After determining the ranges $T_1$-$T_m$ of the inner region of the subject's body in the AP-direction, the flow goes to Step ST3.

At Step ST3, the range identifying unit 9b identifies a range $T_0$ of the liver in the AP-direction based on the ranges $T_1$-$T_m$ of the inner region of the subject's body in the AP-direction. Since the position of the liver in the AP-direction relative to the inner region of the subject's body is generally fixed, the range $T_0$ of the liver in the AP-direction may be identified from the information on the ranges $T_1$-$T_m$. It is unnecessary to accurately determine the range $T_0$ of the liver in the AP-direction and rough identification of the range may suffice. After determining the range $T_0$ of the liver in the AP-direction, the flow goes to Step ST4.

Figure 9:
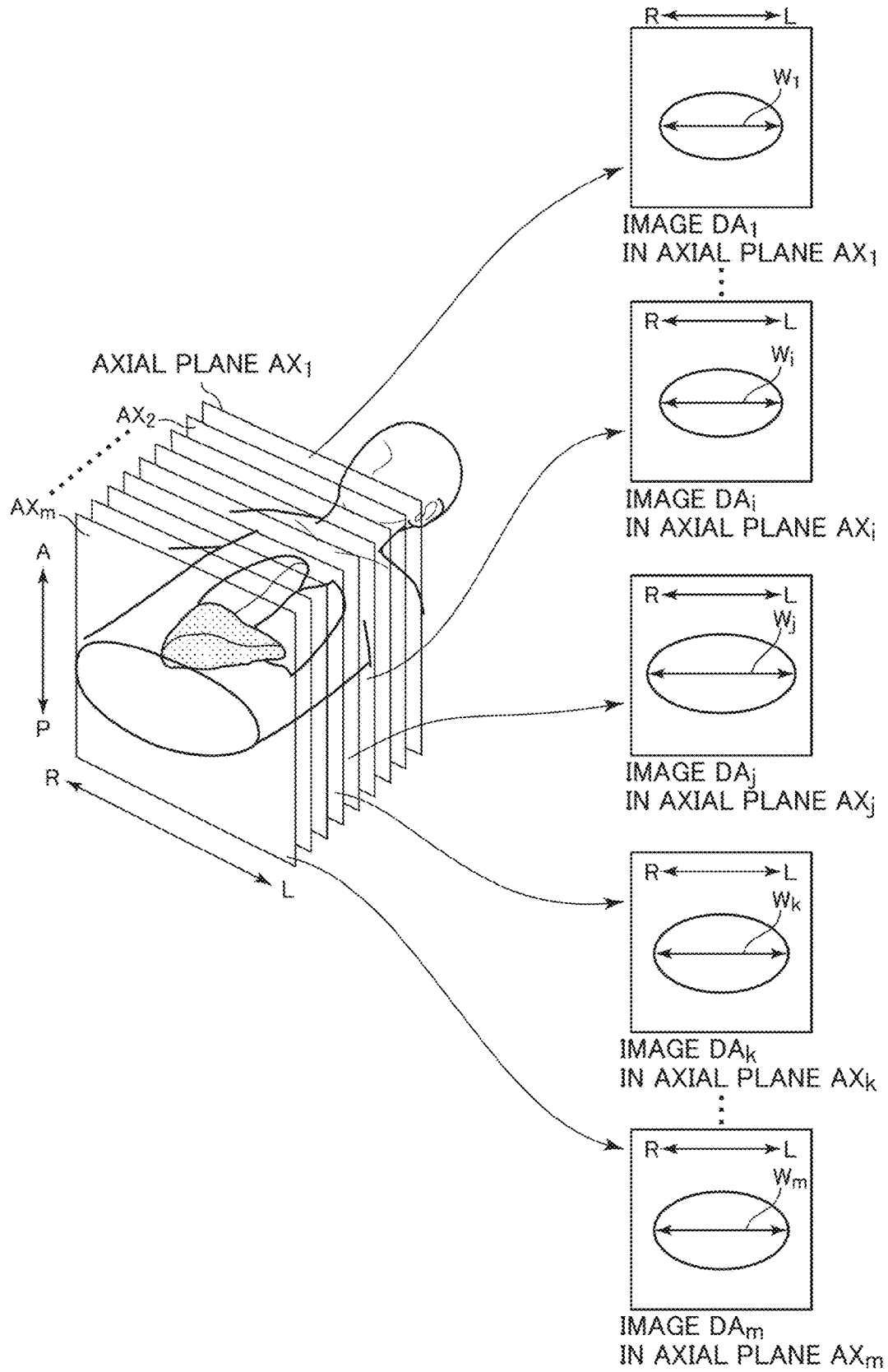
FIG. 9 is a diagram schematically showing ranges $W_1$-$W_m$ of the inner region of the subject's body in an RL-direction.

At Step ST4, the range identifying unit 9b identifies ranges $W_1$-$W_m$ of the inner region of the subject's body in the RL-direction respectively in the axial planes $AX_1$-$AX_m$. FIG. 9 schematically shows the ranges $W_1$-$W_m$ of the inner region of the subject's body in the RL-direction determined respectively for the axial planes $AX_1$-$AX_m$. Since a region outside of the subject's body yields low-intensity signals while the inner region of the subject's body yields high-intensity signals, the ranges $W_1$-$W_m$ of the inner region of the subject's body in the RL-direction may be determined respectively for the axial planes $AX_1$-$AX_m$ from the difference in signal value. After determining the ranges $W_{RL}$ in the RL-direction, the flow goes to Step ST5.

At Step ST5, the range identifying unit 9b identifies a range of the region Rs1 to be searched (see FIG. 14), which will be discussed later, in the RL-direction for searching for pixels lying on the edge of the liver adjacent to the lungs at Step ST8, based on the axial images $DA_1$-$DA_m$ (see FIG. 9). Step ST5 includes Steps ST51 and ST52, which will now be described one by one.

Figure 10:
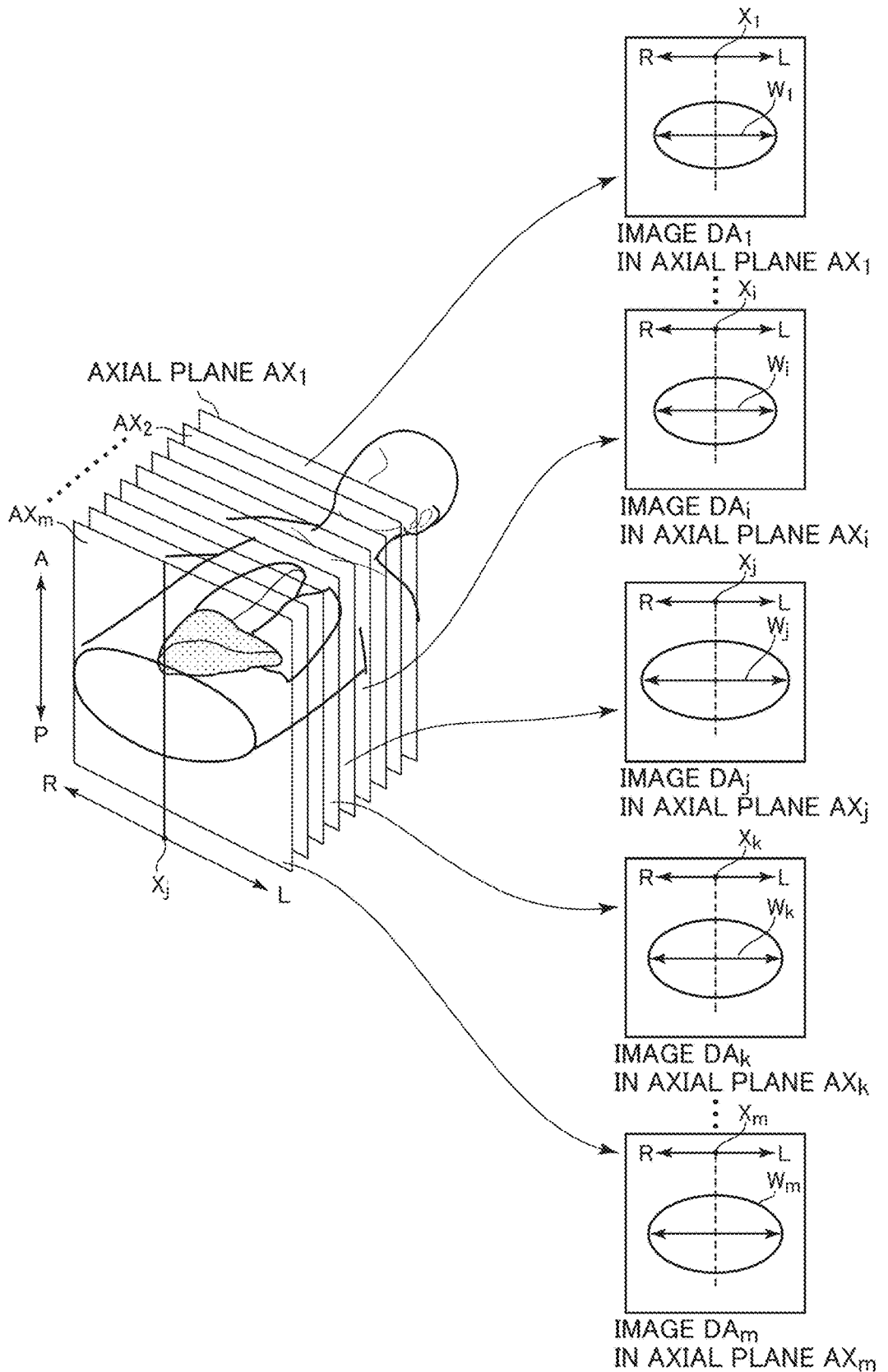
FIG. 10 is a diagram showing center positions $x_1$-$x_m$ of the inner region in the RL-direction.

At Step ST51, the range identifying unit 9b determines a center position of the inner region in the RL-direction for each of the axial images $DA_1$-$DA_m$. Referring to FIG. 10, center positions of the inner region in the RL-direction determined respectively for the axial images $DA_1$-$DA_m$ are designated by symbols "$x_1$"-"$x_m$." Since the ranges $W_1$-$W_m$ of the inner region in the RL-direction have been determined in the axial images $DA_1$-$DA_m$ at Step ST4, the center positions $x_1$-$x_m$ of the inner region in the RL-direction may be determined respectively for the axial images $DA_1$-$DA_m$ from the information on the ranges $W_1$-$W_m$. After determining the center positions $x_1$-$x_m$, the range identifying unit 9b sets a median of these center positions $x_1$-$x_m$ as center position of the subject in the RL-direction. It is assumed here that a center position $x_j$ is the median of the center positions $x_1$-$x_m$. The range identifying unit 9b then determines the center position $x_j$ as center position of the subject in the RL-direction. After determining the center position $x_j$ of the subject in the RL-direction, the flow goes to Step ST52.

Figure 11:
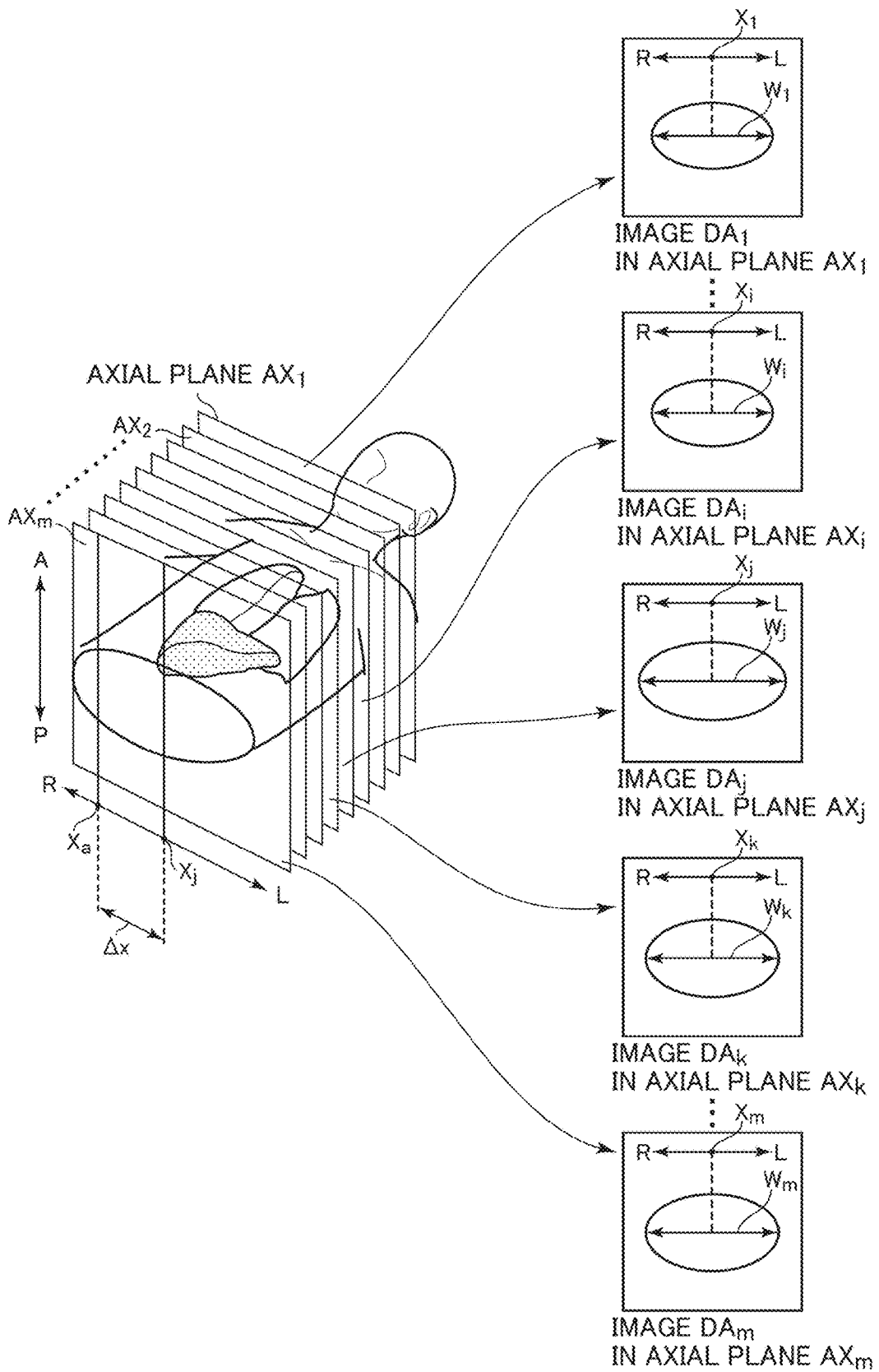
FIG. 11 is a diagram explaining determination of a position $x_a$.

At Step ST52, the range identifying unit 9b determines a position $x_a$ offset from the center position $x_j$ to the R-side by a certain distance $\Delta x$ (see FIG. 11).

FIG. 11 is a diagram explaining determination of the position $x_a$. The range identifying unit 9b first calculates a value of $\Delta x$. The value of $\Delta x$ may be calculated from the following equation, for example:

$$\Delta x = d \cdot r, \quad (1)$$

where d: a length of a torso of the subject in the RL-direction, and r: a coefficient.

In the present embodiment, the ranges $W_1$-$W_m$ of the subject in the RL-direction have been identified in the axial planes $AX_1$-$AX_m$ at Step ST4. Therefore, a length d of the torso of the subject in the RL-direction may be determined from the information on the ranges $W_1$-$W_m$. For example, d=40 cm.

The coefficient r in EQ. (1) has a value determined beforehand prior to imaging, and may be r=0.3, for example. Therefore, when w=40 cm and r=0.3, for example, $\Delta x$=12 cm.

Since $\Delta x$ may be calculated from EQ. (1), the position $x_a$ may be determined. In the present embodiment, a range $x_a$-$x_j$ between the positions $x_a$ and $x_j$ is set as a range of the region Rs1 to be searched (see FIG. 14) in the RL-direction, which will be discussed later. In general, a major portion of the liver lies in the right-side body of the subject, and a part of the liver lies in the left-side body of the subject. Therefore, by determining a position $x_a$ lying away from the center position $x_j$ of the subject in the RL-direction to the R-side (to the right) by a certain distance $\Delta x$, the range $x_a$-$x_j$ may be defined so as not to fall outside the width of the liver in the RL-direction. After determining the range $x_a$-$x_j$, the flow goes to Step ST6.

Figure 12:
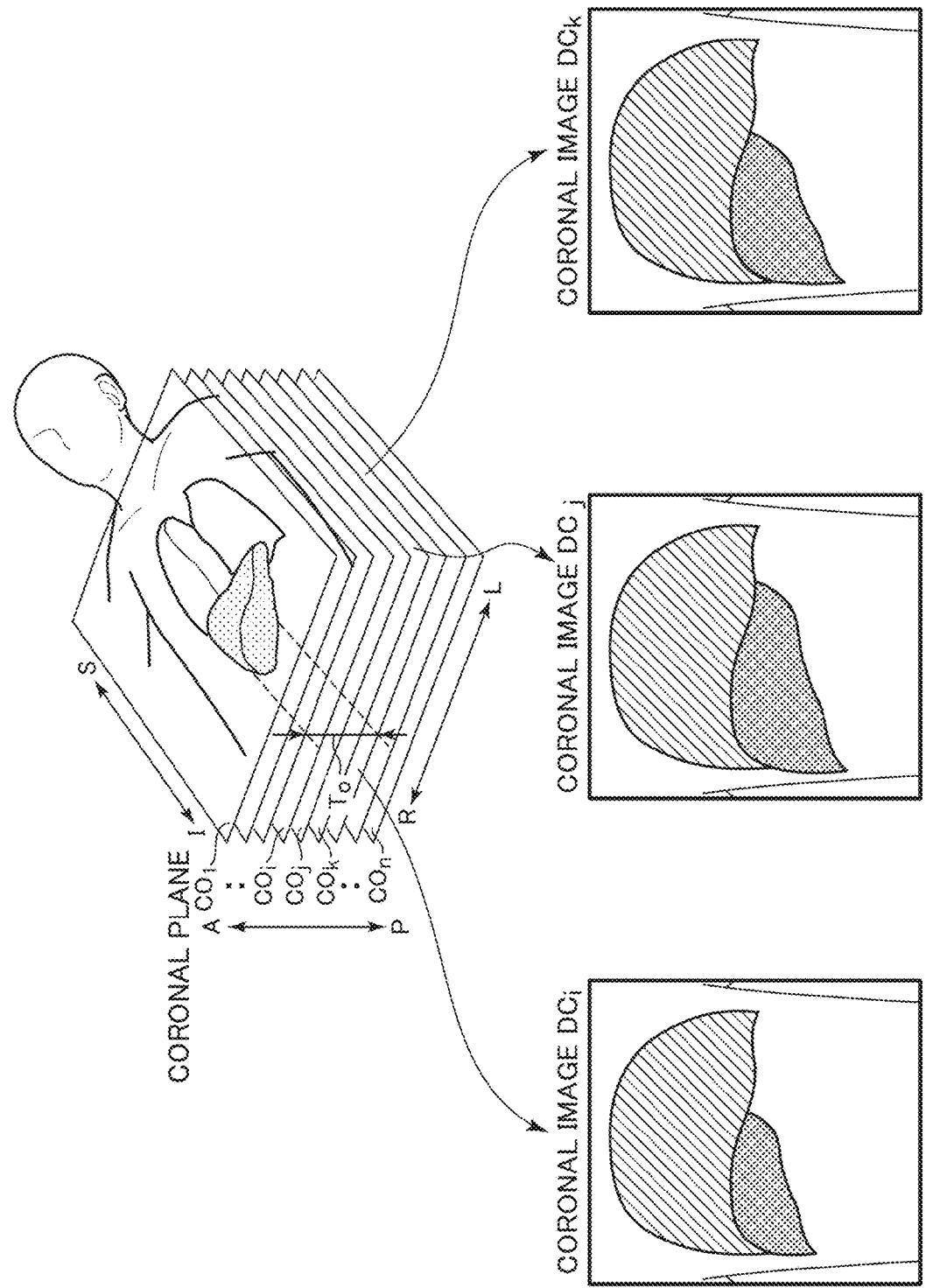
FIG. 12 is a diagram showing coronal images chosen by coronal image choosing unit 9c.

At Step ST6, the coronal image choosing unit 9c (see FIG. 2) chooses some of the coronal images $DC_1$-$DC_n$ (see FIG. 6) passing through the liver. In the present embodiment, the range $T_0$ (see FIG. 8) of the liver in the AP-direction has been identified at Step ST3. Therefore, by identifying coronal images included in the range $T_0$ from among the coronal images $DC_1$-$DC_n$ (see FIG. 6), those passing through the liver may be chosen. FIG. 12 shows coronal images chosen by the coronal image choosing unit 9c. In the present embodiment, the coronal image choosing unit 9c chooses three coronal images $DC_i$, $DC_j$, $DC_k$ as those passing through the liver. After choosing the coronal images $DC_i$, $DC_j$, $DC_k$ passing through the liver, the flow goes to Step ST7.

Figure 13:
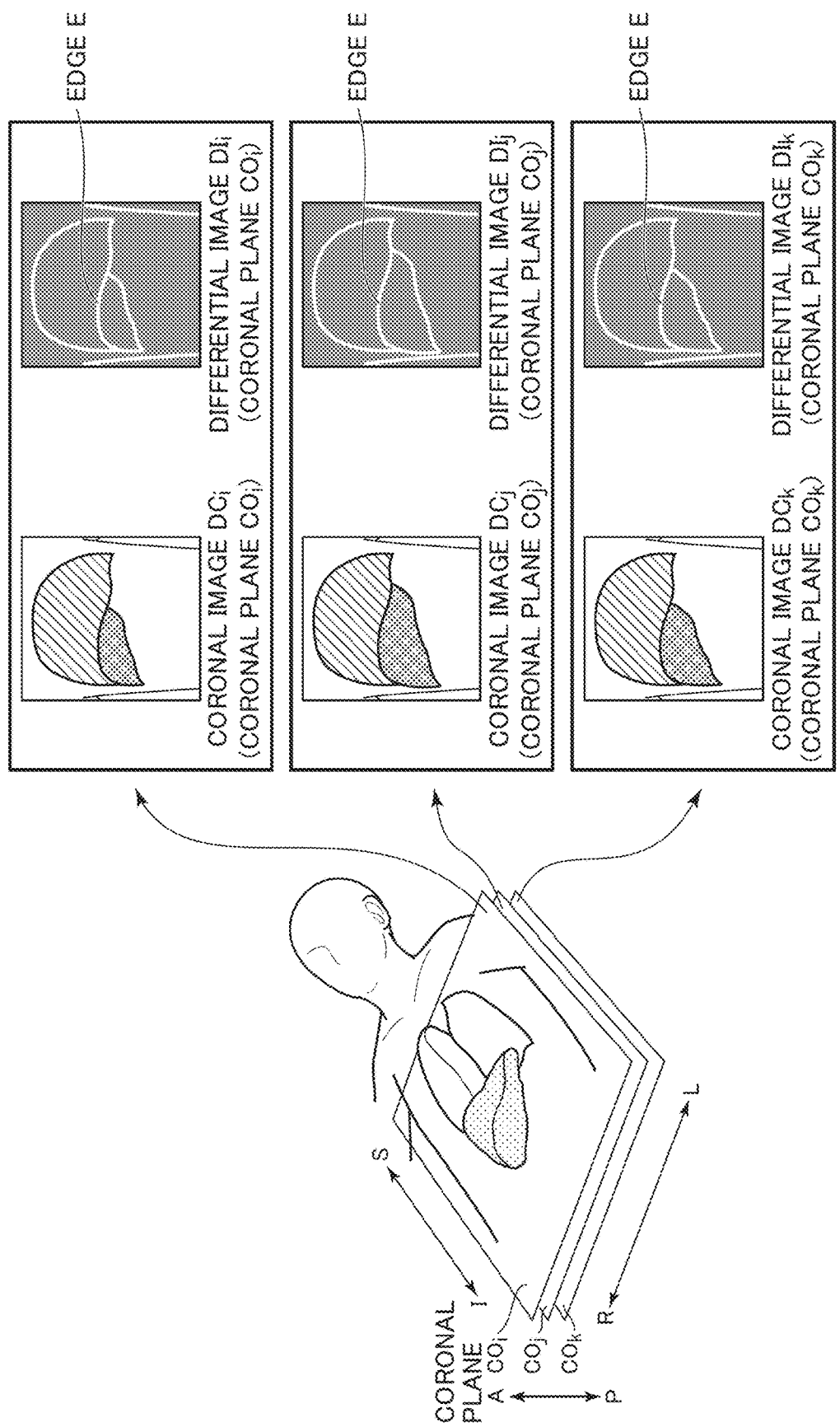
FIG. 13 is a diagram schematically showing differential images $DI_i$, $DI_j$, $DI_k$.

At Step ST7, the image producing unit 9a produces differential images by differentiating the coronal images $DC_i$, $DC_j$, $DC_k$. FIG. 13 schematically shows differential images $DI_i$, $DI_j$, $DI_k$. While there are positive and negative differential values, the differential images $DI_i$-$DI_k$ having their differential values represented by absolute values are shown in FIG. 13 for convenience of explanation.

In the coronal images $DC_i$, $DC_j$, $DC_k$, pixel values of pixels of the liver are significantly different from those of the lungs. Therefore, differentiation of the coronal images $DC_i$, $DC_j$, $DC_k$ gives a greater differential value for a pixel lying at the border between the lungs and liver. In contrast, differential values for pixels inside of the liver and those inside of the lungs are smaller. Therefore, by producing the differential images $DI_i$-$DI_k$, pixels lying on the edge E of the liver adjacent to the lungs may be highlighted. The white portion in the differential images $DI_i$, $DI_j$, $DI_k$ in FIG. 13 indicates a greater differential value while the black portion indicates a smaller differential value. After producing the differential images $DI_i$, $DI_j$, $DI_k$ in the coronal planes $CO_i$, $CO_j$, $CO_k$, the flow goes to Step ST8.

At Step ST8, a position of the edge E of the liver adjacent to the lungs in the SI-direction is determined for each of the coronal planes $CO_i$, $CO_j$, $CO_k$ based on the differential images $DI_i$, $DI_j$, $DI_k$. Step ST8 includes Steps ST81-ST86, which will now be described. It should be noted that the method of determining a position of the edge E of the liver in the SI-direction at Step ST8 is the same for any coronal plane. Therefore, in the following description, a coronal plane $CO_j$ will be taken from the coronal planes $CO_i$, $CO_j$, $CO_k$ to describe the method of determining a position of the edge E of the liver in the SI-direction from the coronal plane $CO_j$.

Figure 14:
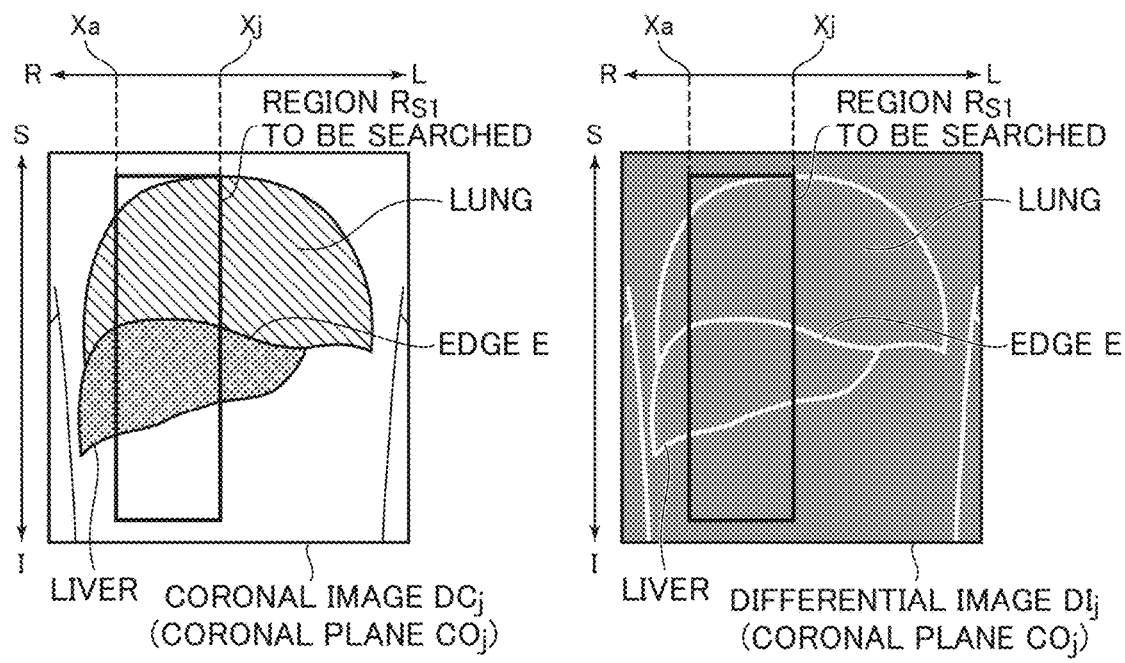
FIG. 14 is a diagram showing a region Rs1 to be searched.

At Step ST81, the search-region defining unit 9d (see FIG. 2) first defines a region (referred to hereinbelow as "region to be searched") Rs1 for which search of pixels is applied in the differential image $DI_j$ of the coronal plane $CO_j$. FIG. 14 shows the region Rs1 to be searched. The range of the region Rs1 to be searched in the RL-direction is set to the range $x_a$-$x_j$ in the RL-direction determined at Step ST5. As described earlier, the range $x_a$-$x_j$ is defined so as not to fall outside the width of the liver in the RL-direction. Therefore, the search-region defining unit 9d may define the region Rs1 to be searched so that its width in the RL-direction does not fall outside the width of the liver in the RL-direction.

In FIG. 14, the region Rs1 to be searched in the coronal image $DC_j$ is also shown to clearly illustrate their positional relationship. After setting the region Rs1 to be searched, the flow goes to Step ST82.

At Step ST82, the pixel choosing unit 9e (see FIG. 2) chooses pixels supposed to be likely to lie on the edge E of the liver from among a plurality of pixels contained in the region Rs1 to be searched. Now the method of choosing the pixels will be described (see FIG. 15).

Figure 15:
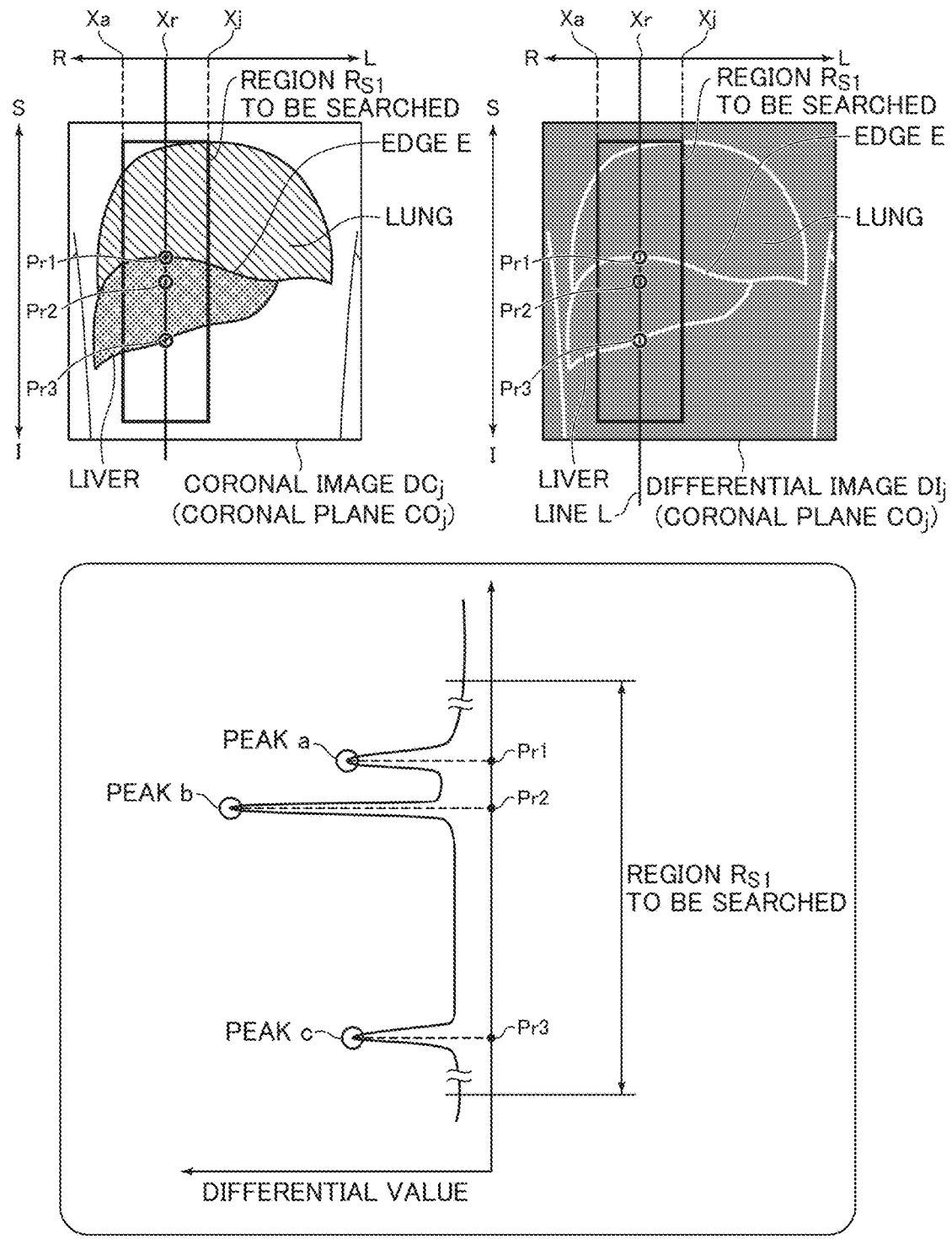
FIG. 15 is a diagram explaining choice of pixels likely to lie on an edge E of a liver from within the region Rs1 to be searched.

FIG. 15 is a diagram explaining choice of pixels likely to lie on the edge E of the liver from within the region Rs1 to be searched. The pixel choosing unit 9e assumes a line L in the SI-direction within the region Rs1 to be searched in the differential image $DI_j$, and determines a profile of the differential value of the pixels along the line L. In FIG. 15, a profile of the differential value along the line L at coordinate value $x=x_r$ in the RL-direction is shown. While there are positive and negative differential values in practice, only positive differential values will be addressed in FIG. 15 for convenience of explanation.

As described earlier, pixels lying on the border between the lungs and liver have greater differential values. Therefore, by detecting a peak appearing in the profile within the region Rs1 to be searched, pixels likely to lie on the edge E of the liver may be chosen. Referring to FIG. 15, three peaks a, b, c appear in the profile of the differential value. Therefore, pixels $P_{r1}$, $P_{r2}$, $P_{r3}$ corresponding to the peaks a, b, c are chosen as the pixels likely to lie on the edge E of the liver.

By thus using a differential image of a coronal image, pixels likely to lie on the edge E of the liver may be chosen.

Figure 16:
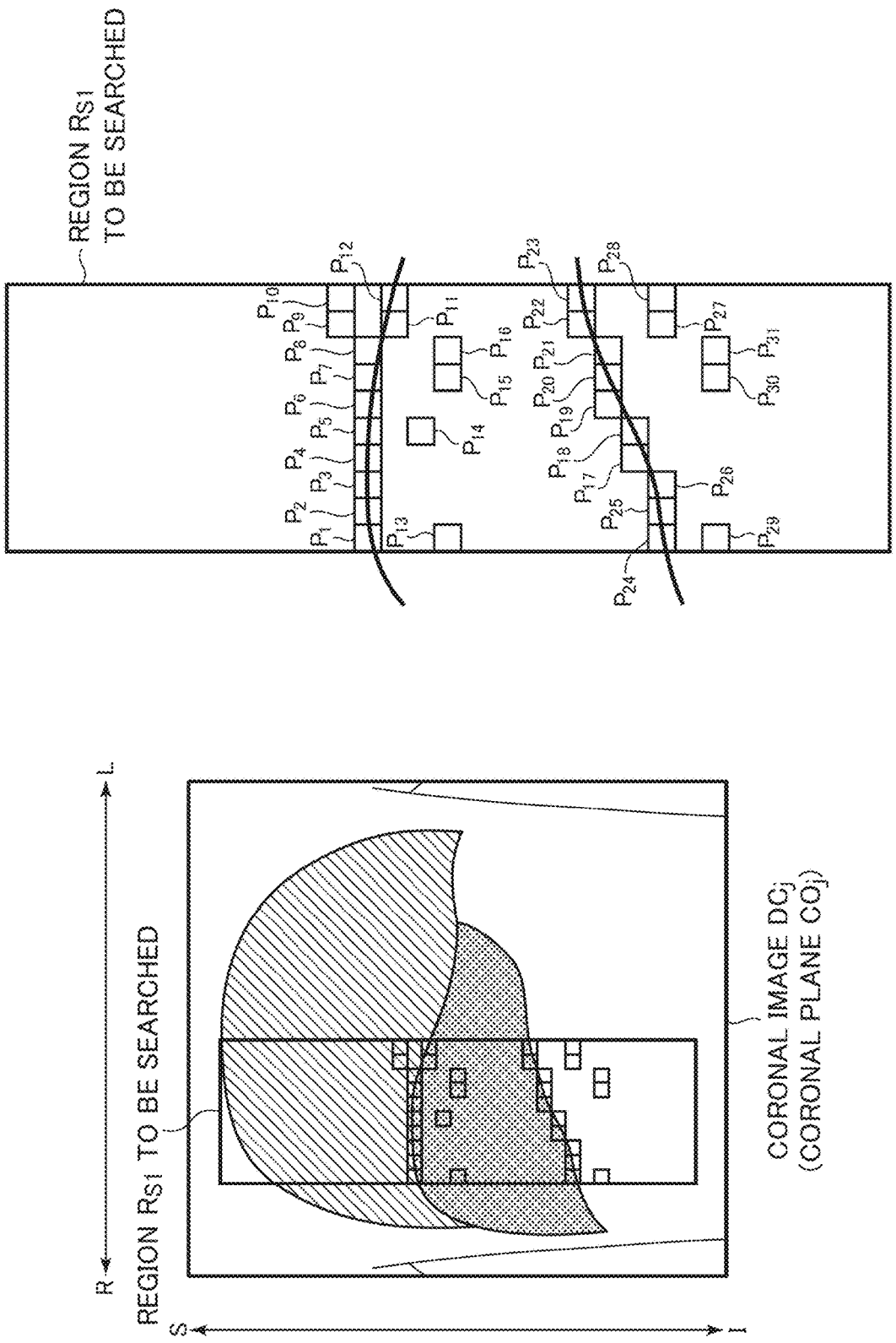
FIG. 16 is a diagram schematically showing pixels chosen as being likely to lie on the edge E of the liver from within the region Rs1 to be searched.

The preceding description addresses the method of choosing pixels likely to lie on the edge E of the liver along the line L at the coordinate value $x=x_r$. However, even if the line L has coordinate values other than $x=x_r$, pixels likely to lie on the edge E of the liver may be chosen in a similar manner. Therefore, pixels likely to lie on the edge E of the liver may be chosen from within the region Rs1 to be searched by changing the coordinate value x of the line L in the RL-direction within the region Rs1 to be searched, determining a profile of the differential value along the line L at each coordinate value x, and detecting a peak for each of the profiles. FIG. 16 schematically shows pixels chosen as being likely to lie on the edge E of the liver from within the region Rs1 to be searched. In FIG. 16, a differential image is omitted from the drawing and a coronal image $DC_j$ is shown. The chosen pixels are represented by boxes (squares). In FIG. 16, to better visualize pixels chosen from within the region Rs1 to be searched, the size of the pixels is exaggerated. FIG. 16 also shows on its right side an enlarged view of the region Rs1 to be searched, in which the chosen pixels are designated by symbols "P1"-"P31." After choosing the pixels P1-P31 from the region Rs1 to be searched, the flow goes to Step ST83.

At Step ST83, the calculating unit 9f (see FIG. 2) calculates an indicator VI representing a likelihood that each pixel P1-P31 chosen at Step ST82 lies on the edge E of the liver. In the present embodiment, the indicator VI is set to take a value between zero and one, wherein an indicator VI closer to one signifies a higher likelihood that the pixel lies on the edge E of the liver while an indicator VI closer to zero signifies a lower likelihood that the pixel lies on the edge of the liver. Now the method of calculating the indicator VI will be described.

In the present embodiment, the calculating unit 9f calculates the indicator VI using a classifier prepared beforehand prior to imaging the subject. Therefore, the following description will explain the classifier first, and then, the method of calculating the indicator VI will be explained after the classifier.

The classifier is for distinguishing pixels lying on the edge of the liver from those not lying on the edge of the liver, and is generated beforehand prior to imaging the subject. In the present embodiment, the classifier is generated by machine learning. In particular, supervised data is prepared, and a classifier suitable for distinguishing pixels lying on the edge of the liver from those not lying on the edge of the liver is generated by using an algorithm of machine learning to learn the supervised data (see FIG. 17).

Figure 17:
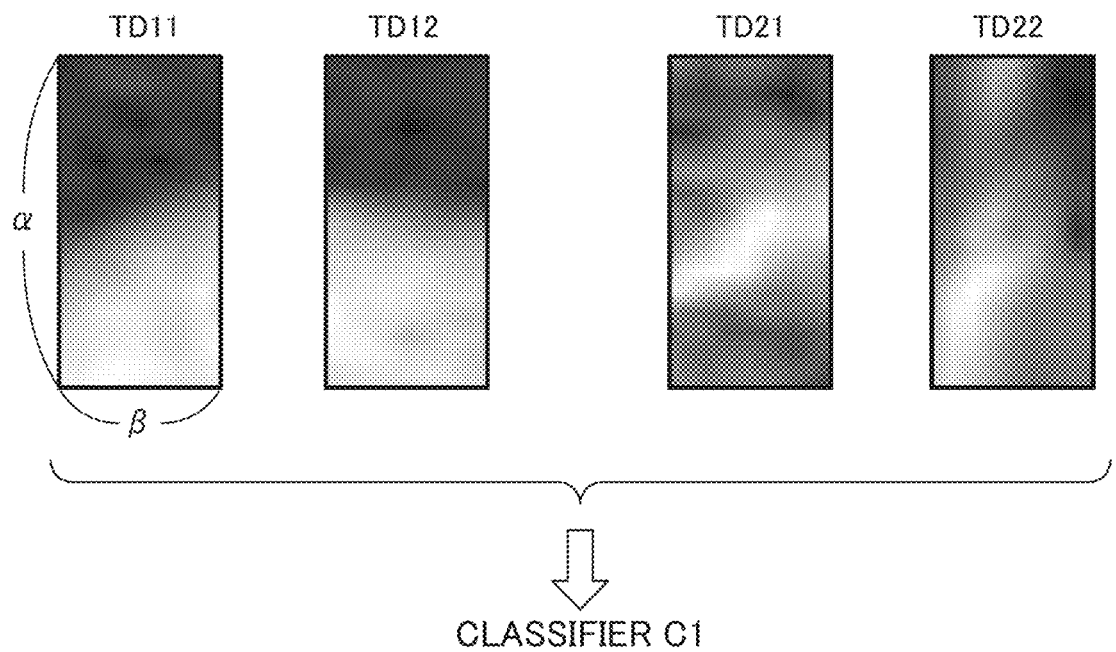
FIG. 17 is a diagram showing exemplary supervised data used for generating a classifier.

FIG. 17 is a diagram showing exemplary supervised data used for generating a classifier. The supervised data may be generated using axial images of the abdomen or chest acquired by imaging a plurality of actual human beings. In the present embodiment, two kinds of supervised data are employed as the supervised data. The supervised data TD11 and TD12 are data including the edge of the liver, while supervised data TD21 and TD22 are data not including the edge of the liver. Each set of the supervised data TD11, TD12, TD21, and TD22 is defined as data in a rectangular region of $\alpha \times \beta$ pixels. In FIG. 17, only two sets of supervised data including the edge of the liver (supervised data TD11 and TD12) and two sets of supervised data not including the edge of the liver (supervised data TD21 and TD22) are shown for convenience of explanation. However, several hundred sets of supervised data are prepared in practice. Then, a classifier C1 suitable for distinguishing pixels lying on the edge of the liver from those not lying on the edge of the liver is generated by using the algorithm of machine learning to learn the supervised data.

The calculating unit 9f calculates an indicator VI representing a likelihood that each pixel P1-P31 (see FIG. 16) lies on the edge of the liver using the classifier C1 generated as described above. The method of calculating the indicator VI will be described hereinbelow.

Figure 18:
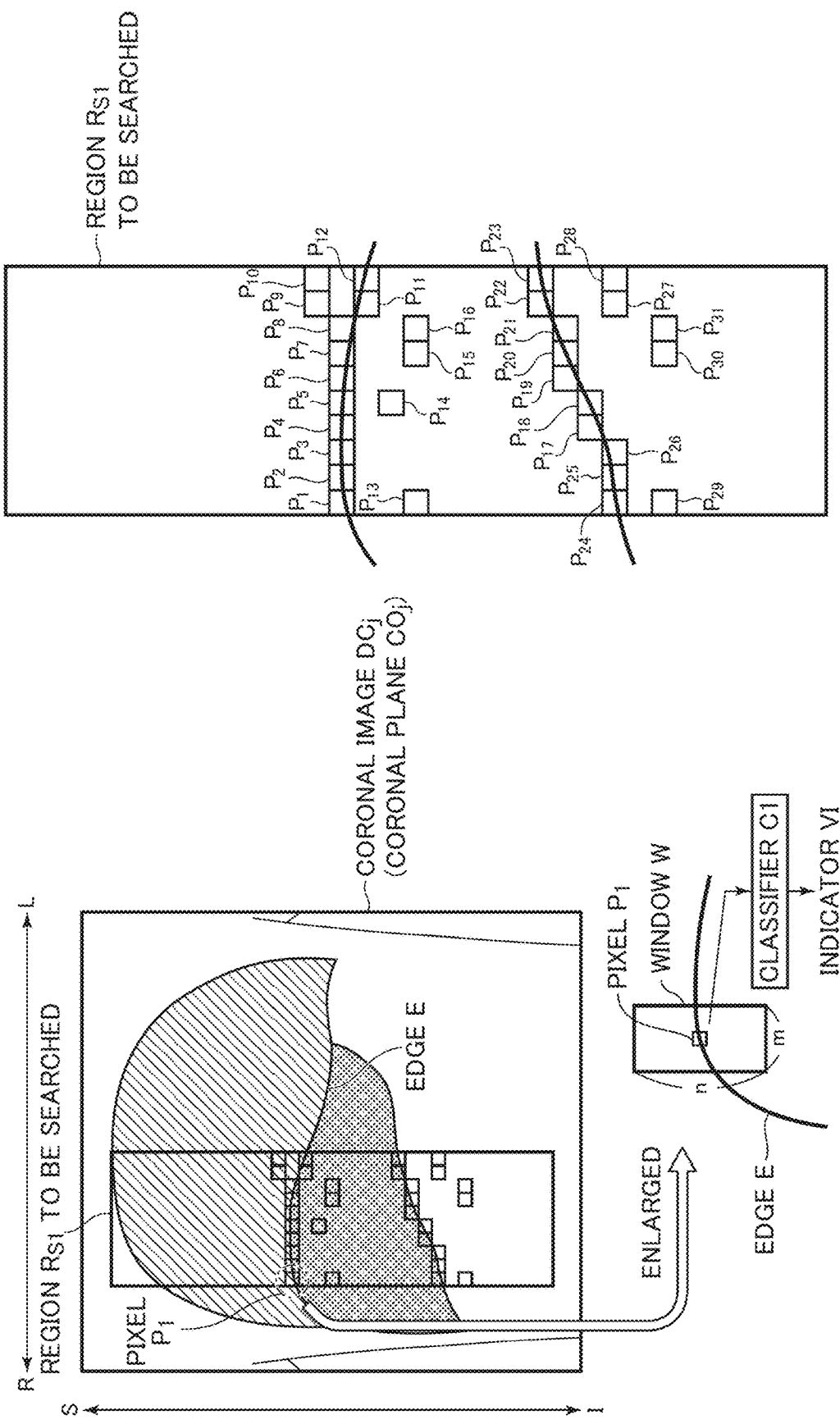
FIG. 18 is a diagram explaining definition of a window W.

The calculating unit 9f first defines a window W for each of the pixels P1-P31. FIG. 18 is a diagram explaining definition of the window W. FIG. 18 shows an example of a window W defined for a pixel P1. The calculating unit 9f defines the window W centering at the pixel P1. The size of the window W is n×m pixels (for example, a size of 37×13 pixels). In FIG. 18, the size of the pixel P1 is exaggerated relative to that of the window W to clearly illustrate their positional relationship.

After positioning the window W, the calculating unit 9f extracts pixel data within the window W and supplies them to the classifier C1. Based on the extracted data, the classifier C1 outputs an indicator VI representing a likelihood that the pixel P1 lies on the edge of the liver. As described earlier, the indicator VI is set to take a value between zero and one, wherein an indicator VI closer to one signifies a higher likelihood that the pixel lies on the edge of the liver while an indicator VI closer to zero signifies a lower likelihood that the pixel lies on the edge of the liver. Thus, whether the likelihood that the pixel P1 lies on the edge of the liver is high or low can be known from the value of the indicator VI.

Figure 19:
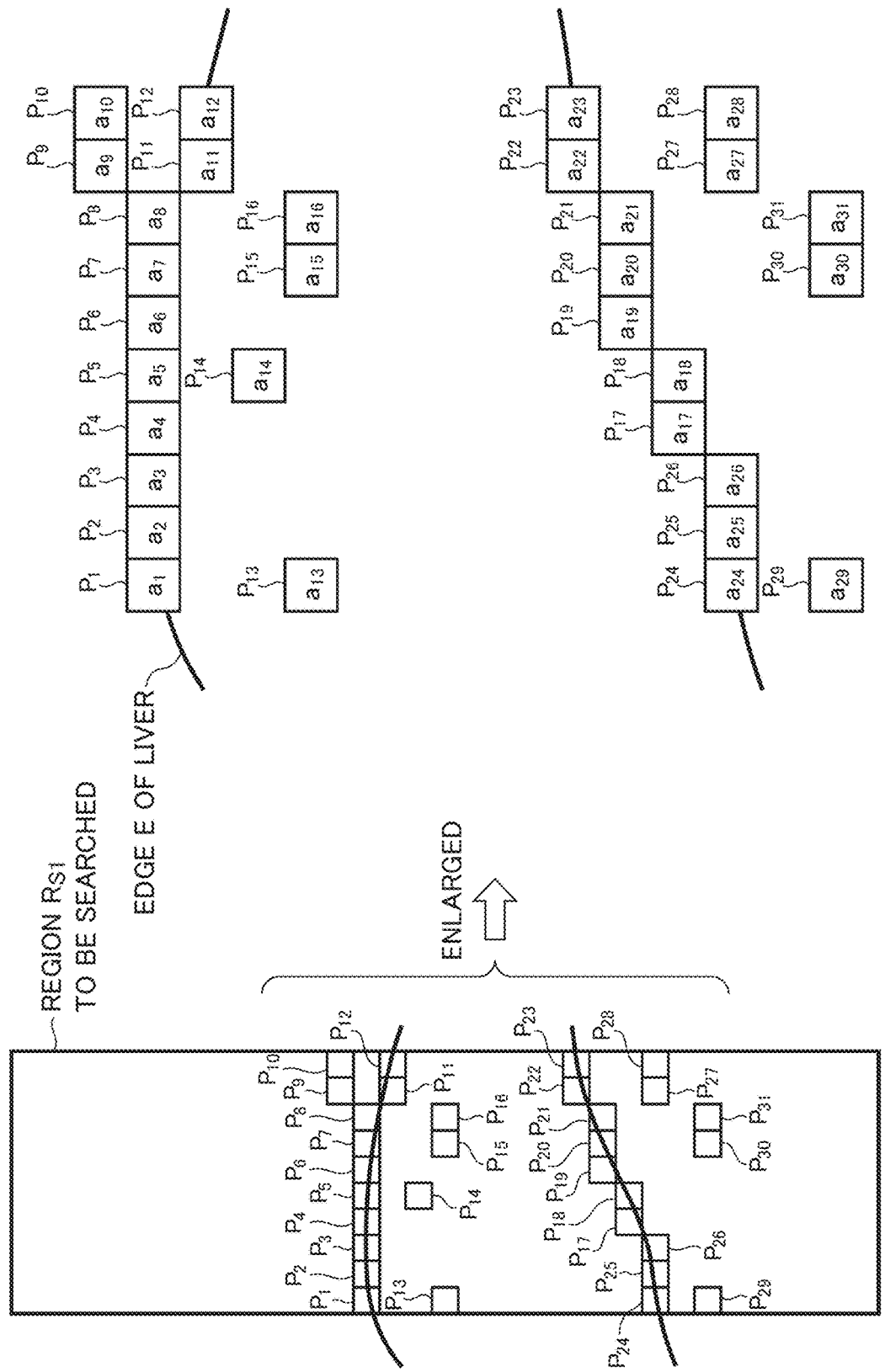
FIG. 19 is a diagram showing indicators VI calculated for all pixels P1-P31.

While the method of determining the indicator VI for the pixel P1 is illustrated in FIG. 18, the indicator VI is calculated using the classifier C1 for other pixels P2-P31 in a similar manner. Therefore, the indicator VI may be output for all pixels P1-P31. FIG. 19 shows indicators VI calculated for all pixels P1-P31. FIG. 19 shows on its right side an enlarged view of the pixels P1-P31 chosen from within the region Rs1 to be searched. Characters a1-a31 given in boxes (squares) representing the pixels P1-P31 denote the indicator VI for the pixels P1-P31. The values a1-a31 are in a range of $0 \leq a1\text{-}a31 \leq 1$. As described earlier, an indicator VI closer to one signifies a higher likelihood that the pixel lies on the edge E of the liver while an indicator VI closer to zero signifies a lower likelihood that the pixel lies on the edge E of the liver. Referring to FIG. 19, for example, the pixel P1 lies on the edge E of the liver. Therefore, the indicator VI=a1 for the pixel P1 has a value close to one. After calculating the indicator VI, the flow goes to Step ST84.

At Step ST84, the histogram generating unit 9g (see FIG. 2) generates a histogram of the indicator for pixels. Now the method of generating the histogram will be described.

Figure 20:
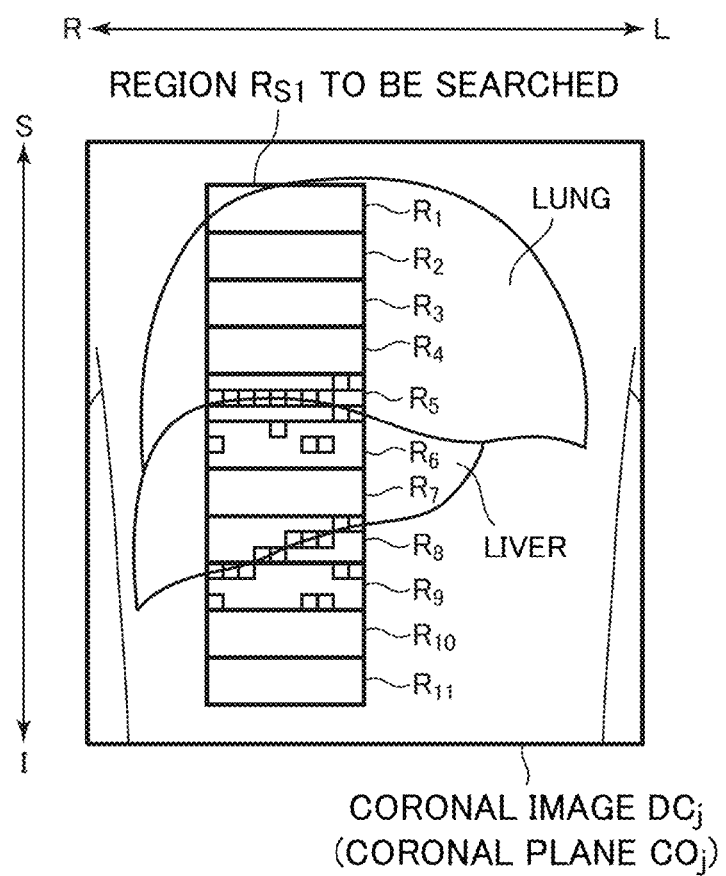
FIG. 20 is a diagram showing a condition in which the region to be searched is divided into a plurality of sub-regions in the SI-direction.

The histogram generating unit 9g first divides the region Rs1 to be searched into a plurality of sub-regions in the SI-direction. FIG. 20 shows the region Rs1 to be searched divided into a plurality of sub-regions in the SI-direction. In FIG. 20, an example of the region Rs1 to be searched divided into eleven sub-regions R1-R11 (an example for the number of division DN=11). After dividing the region Rs1 to be searched, the histogram generating unit 9g adds the indicator VI for the pixels together on a sub-region-by-sub-region basis (see FIG. 21).

Figure 21:
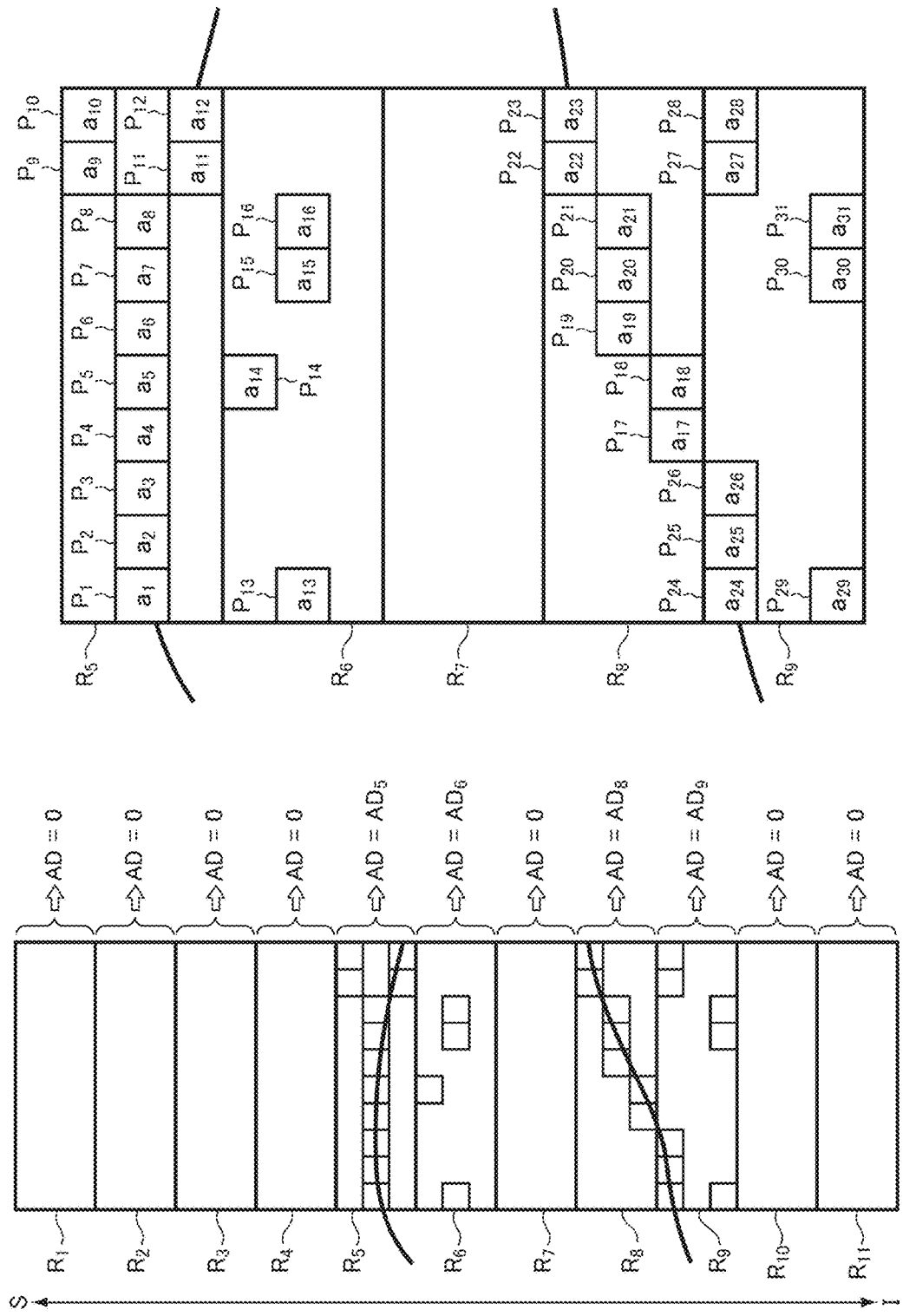
FIG. 21 is a diagram explaining addition of the indicator VI of pixels on a sub-region-by-sub-region basis.

FIG. 21 is a diagram explaining addition of the indicator VI of pixels on a sub-region-by-sub-region basis. FIG. 21 shows on its left side the sub-regions R1-R11 of the region Rs1 to be searched, and on its right side enlarged sub-regions R5-R9.

The histogram generating unit 9g first decides whether there is or not a pixel having an indicator VI calculated within the sub-region R1. In the present embodiment, there is no pixel having an indicator calculated within the sub-region R1. In this case, it is considered that no edge of the liver is included in the sub-region R1, and accordingly, the indicator VI is regarded as VI=0 (zero). Therefore, a sum value AD of the indicator VI for pixels within the sub-region R1 is AD=0. After calculating the sum value AD in the sub-region R1, a sum value AD in a sub-region R2 is calculated.

Similarly to the sub-region R1, the sub-region R2 includes no pixel having an indicator VI calculated, resulting in AD=0. Likewise, sub-regions R3 and R4 also have a sum value AD of AD=0. After calculating the sum value AD in the sub-region R4, a sum value AD in a sub-region R5 is calculated.

The sub-region R5 includes pixels P1-P12 having indicators VI calculated. Therefore, the histogram generating unit 9g adds the indicators a1-a12 for the pixels P1-P12 together. In this example, the sum value AD for the indicators a1-a12 is AD=AD5. After calculating the sum value AD5 for the sub-region R5, a sum value AD in a sub-region R6 is calculated.

The sub-region R6 includes pixels P13-P16 having indicators VI calculated. Therefore, the histogram generating unit 9g adds the indicators a13-a16 for the pixels P13-P16 together. In this example, the sum value AD for the indicators a13-a16 is AD=AD6. After calculating the sum value AD6 for the sub-region R6, a sum value AD in a sub-region R7 is calculated.

The sub-region R7 include no pixel having an indicator VI calculated, and therefore, the sum value AD=0. After calculating the sum value AD in the sub-region R7, a sum value AD in a sub-region R8 is calculated.

The sub-region R8 includes pixels P17-P23 having indicators VI calculated. Therefore, the histogram generating unit 9g adds the indicators a17-a23 for the pixels P17-P23 together. In this example, the sum value AD for the indicators a17-a23 is AD=AD8. After calculating the sum value AD8 for the sub-region R8, a sum value AD in a sub-region R8 is calculated.

The sub-region R9 includes pixels P24-P31 having indicators VI calculated. Therefore, the histogram generating unit 9g adds the indicators a24-a31 for the pixels P24-P31 together. In this example, the sum value AD for the indicators a24-a31 is AD=AD9. After calculating the sum value AD9 in the sub-region R9, sum values AD in sub-regions R10 and R11 are calculated.

The sub-regions R10 and R11 include no pixel having an indicator VI calculated, and therefore, the sum value AD=0.

Figure 22:
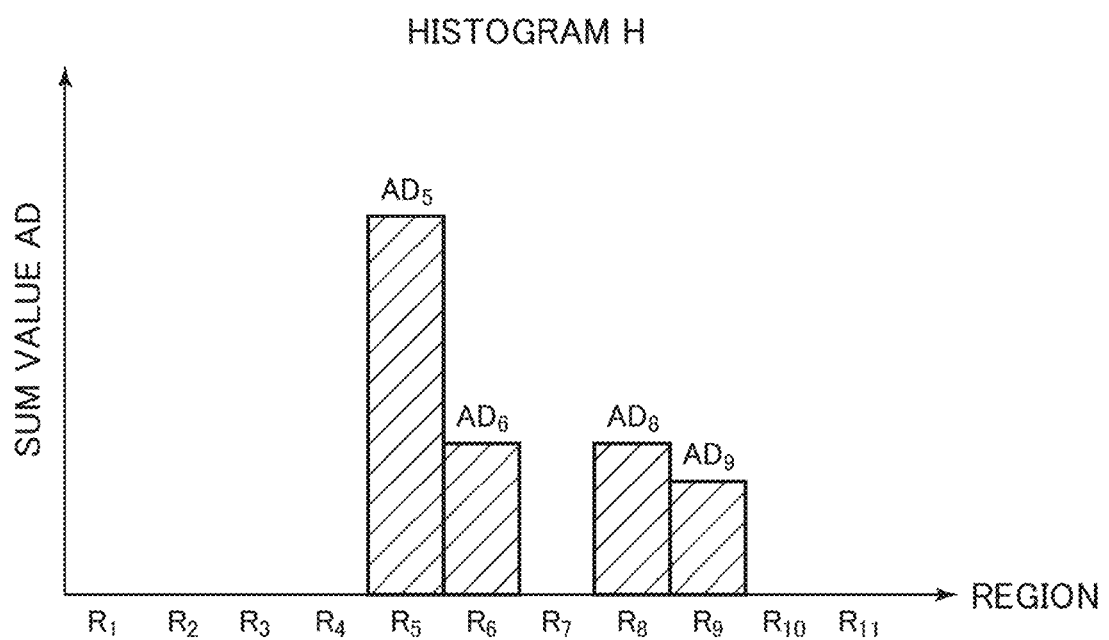
FIG. 22 is a diagram schematically showing a histogram H.

In this way, the sum value AD can be calculated for each of the sub-regions R1-R11. This gives a histogram representing a relationship between the sub-regions R1-R11 and sum value AD. FIG. 22 schematically shows a histogram H. After generating the histogram H, the flow goes to Step ST85.

At Step ST85, the sub-region choosing unit 9h (see FIG. 2) chooses one of the sub-regions R1-R11 most likely to include the edge E of the liver based on the histogram H. As described earlier, the likelihood that a pixel lies on the edge E of the liver is lower for a smaller indicator VI for that pixel while the likelihood is higher for a greater indicator for that pixel. Therefore, it may be contemplated that the likelihood that the edge E of the liver is included within the sub-region is lower for a smaller sum value AD while the likelihood is higher for a larger sum value AD. Accordingly, the sub-region choosing unit 9h compares in the histogram H the sum values AD for the plurality of sub-regions R1-R11 with one another, and chooses one of the plurality of sub-regions R1-R11 having a greatest sum value AD as sub-region most likely to include the edge. In this example, it is assumed that the sum value AD for the sub-region R5 is greatest. Therefore, the sub-region choosing unit 9h chooses the sub-region R5 as sub-region most likely to include the edge. After choosing the sub-region R5, the flow goes to Step ST86.

Figure 23:
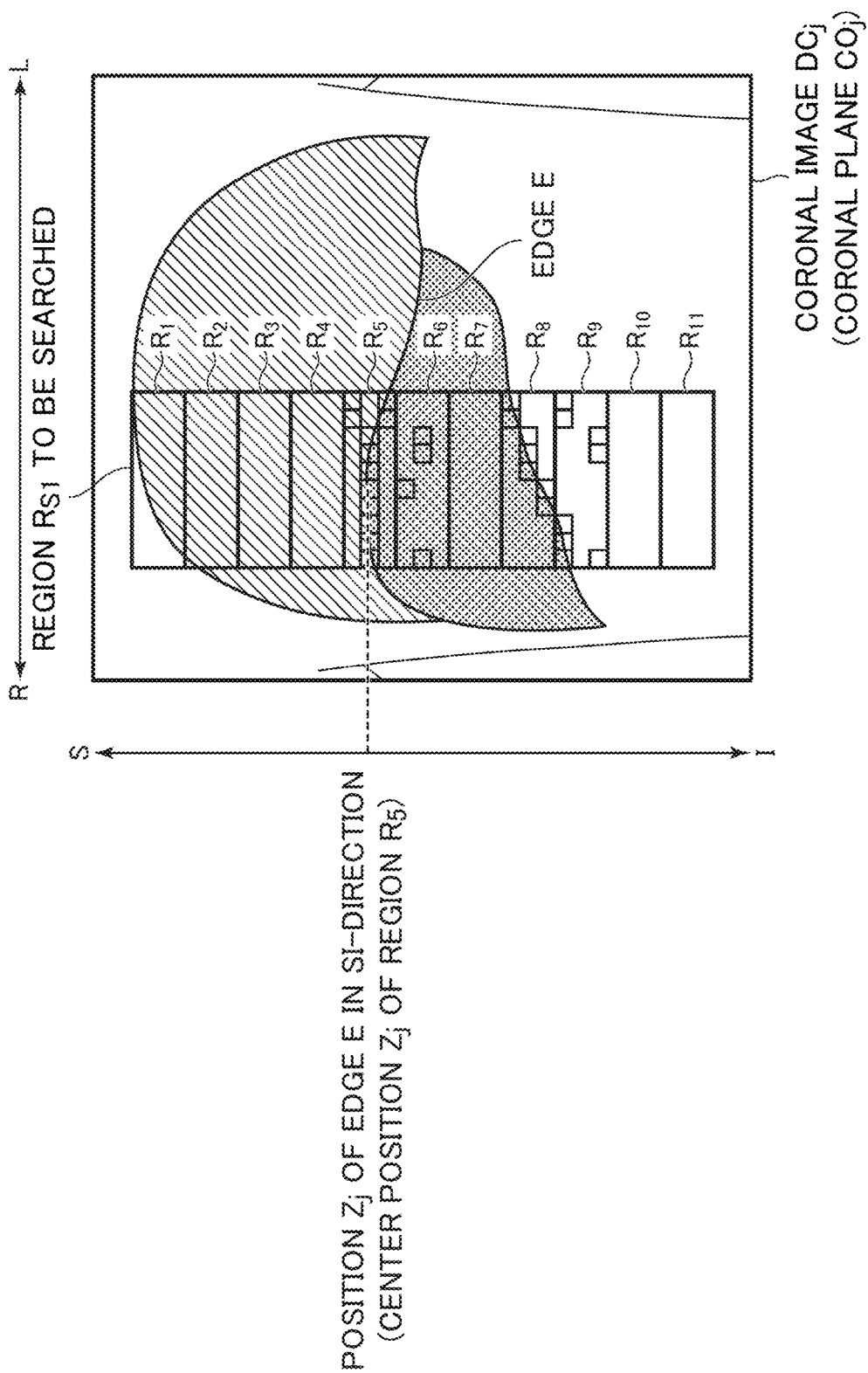
FIG. 23 is a diagram showing a center position $z_j$ of a sub-region R5 in the SI-direction.

At Step ST86, the center position identifying unit 9i (see FIG. 2) identifies a center position $z_j$ of the sub-region R5 in the SI-direction. FIG. 23 shows the center position $z_j$ of the sub-region R5 in the SI-direction. In the present embodiment, the center position $z_j$ is determined as position $z_j$ of the edge E of the liver in the coronal plane $CO_j$ in the SI-direction.

Figure 24:
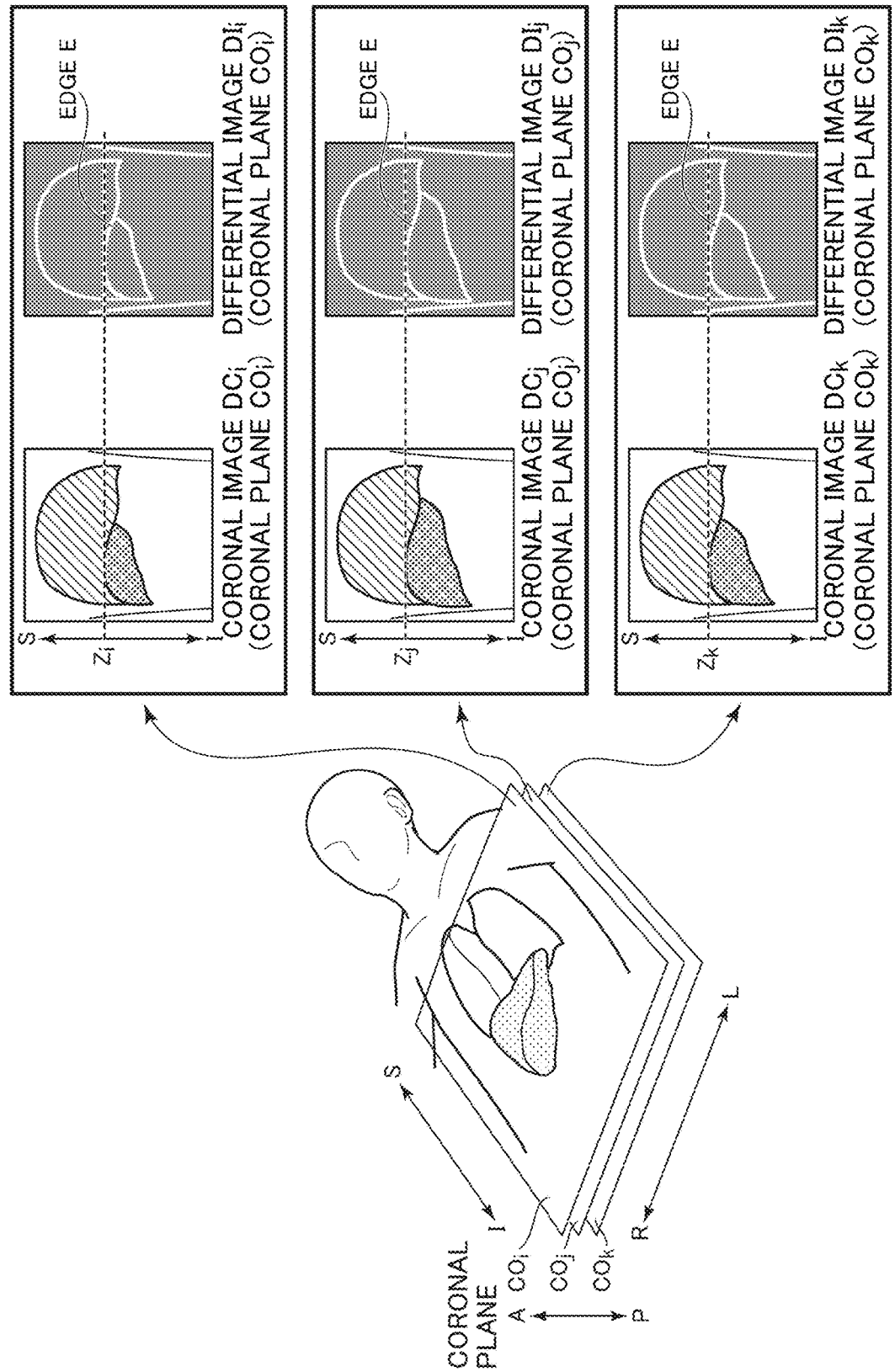
FIG. 24 is a diagram schematically showing positions $z_i$, $z_j$, and $z_k$ of the edge E of the liver in the SI-direction determined respectively for the coronal planes $CO_i$, $CO_j$, and $CO_k$.

While the method of determining a position of the edge E of the liver in the coronal plane $CO_j$ in the SI-direction is illustrated in FIGS. 14-23, the position of the edge E of the liver in the SI-direction may be determined for the other coronal planes $CO_i$ and $CO_k$ in a similar manner. Therefore, the position of the edge E of the liver in the SI-direction may be determined for each of the coronal plane $CO_i$, $CO_j$, and $CO_k$. FIG. 24 schematically shows the positions $z_i$, $z_j$, and $z_k$ of the edge E of the liver in the SI-direction determined respectively for the coronal planes $CO_i$, $CO_j$, and $CO_k$. After determining the position of the edge E in the SI-direction for each coronal plane, the flow goes to Step ST9.

At Step ST9, a pixel lying on the edge of the liver is detected based on the position of the edge E of the liver in the SI-direction for each of the coronal planes $CO_i$, $CO_j$, and $CO_k$. Step ST9 includes Step ST91-ST93. Now Steps ST91-ST93 will be described. It should be noted the method of detecting a pixel lying on the edge E of the liver at Step ST9 is the same for any coronal plane. Therefore, in the following description, the coronal plane $CO_j$ will be taken from the coronal planes $CO_i$, $CO_j$, $CO_k$ to describe the method of detecting a pixel lying on the edge E of the liver from the coronal plane $CO_j$.

Figure 25:
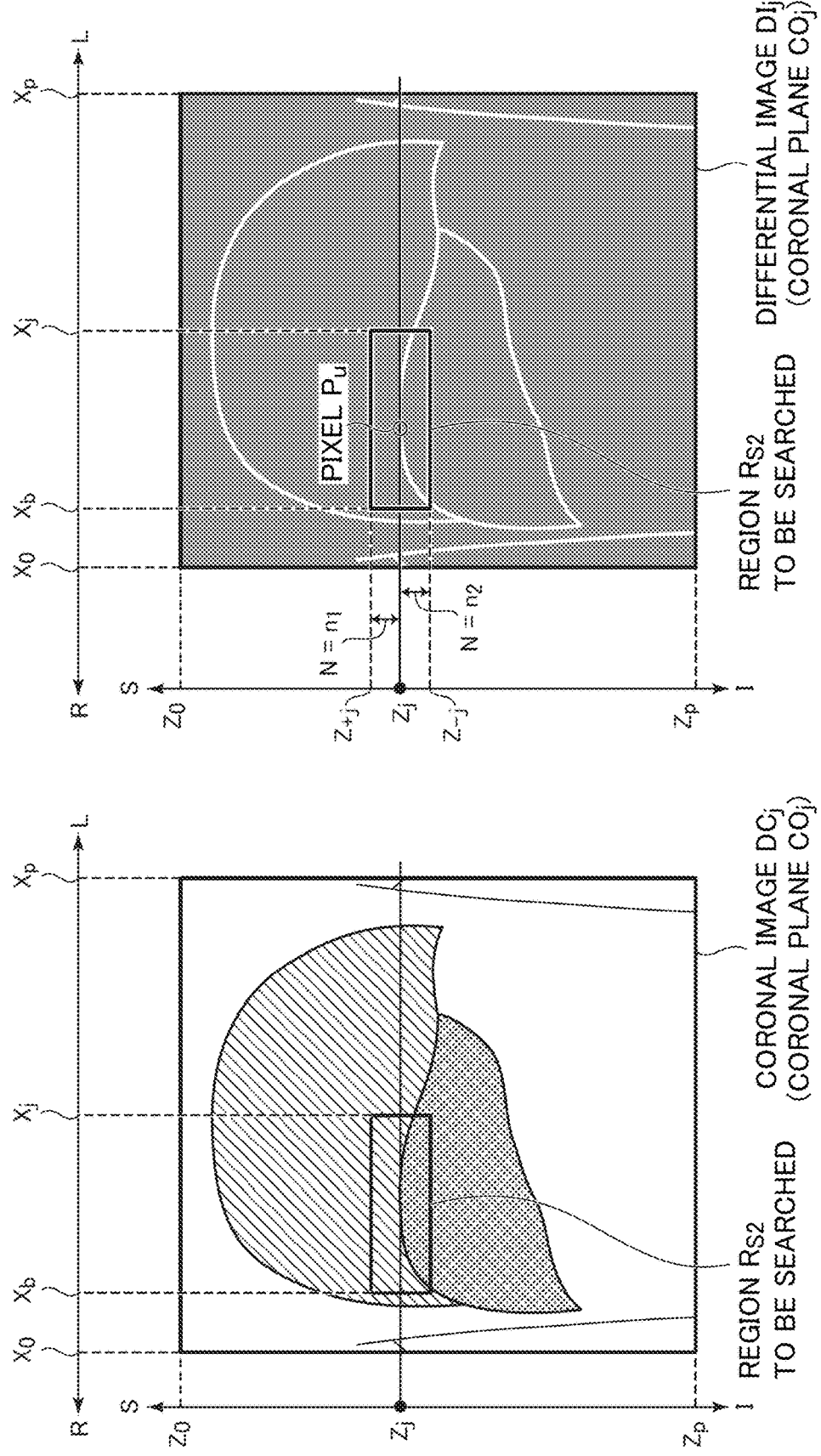
FIG. 25 is a diagram schematically showing a region Rs2 to be searched defined in the differential image $DI_j$.

At Step ST91, the search-region defining unit 9d defines a region Rs2 to be searched representing a range for which search of pixels lying on the edge E of the liver is applied in a differential image $DI_j$ in the coronal plane $CO_j$. FIG. 25 schematically shows the region Rs2 to be searched defined in the differential image $DI_j$. In FIG. 25, a range in the differential image $DI_j$ in the RL-direction is represented by $x_0$-$x_p$, and that in the SI-direction by $z_0$-$z_p$. The range in the region Rs2 to be searched in the RL-direction is defined between positions $x_b$ and $x_j$. In the present embodiment, the position $x_b$ is set to a position as close to x=0 as possible so that a pixel Pu lying on an upper end of the liver (which is a pixel having a coordinate value z in the SI-direction closest to z=z0 among those lying on the edge of the liver) does not fall outside the region Rs2 to be searched. The search-region defining unit 9d also defines a range of the region Rs2 to be searched in the SI-direction based on the position $z_j$ of the edge E of the liver in the SI-direction. In the present embodiment, the range of the region Rs2 to be searched in the SI-direction is defined between positions $z_{+j}$ and $z_j$. The position $z_{+j}$ is set at a position away from the position $z_j$ by a number of pixels N=n1 to the S-side, and the position $z_{-j}$ at a position away from the position $z_j$ by a number of pixels N=n2 to the I-side. The values n1 and n2 are n1=n2=15 pixels, for example.

In FIG. 25, the region Rs2 to be searched in the coronal image $DC_j$ is also shown to clearly illustrate their positional relationship. After setting the region Rs2 to be searched, the flow goes to Step ST92.

Figure 26:
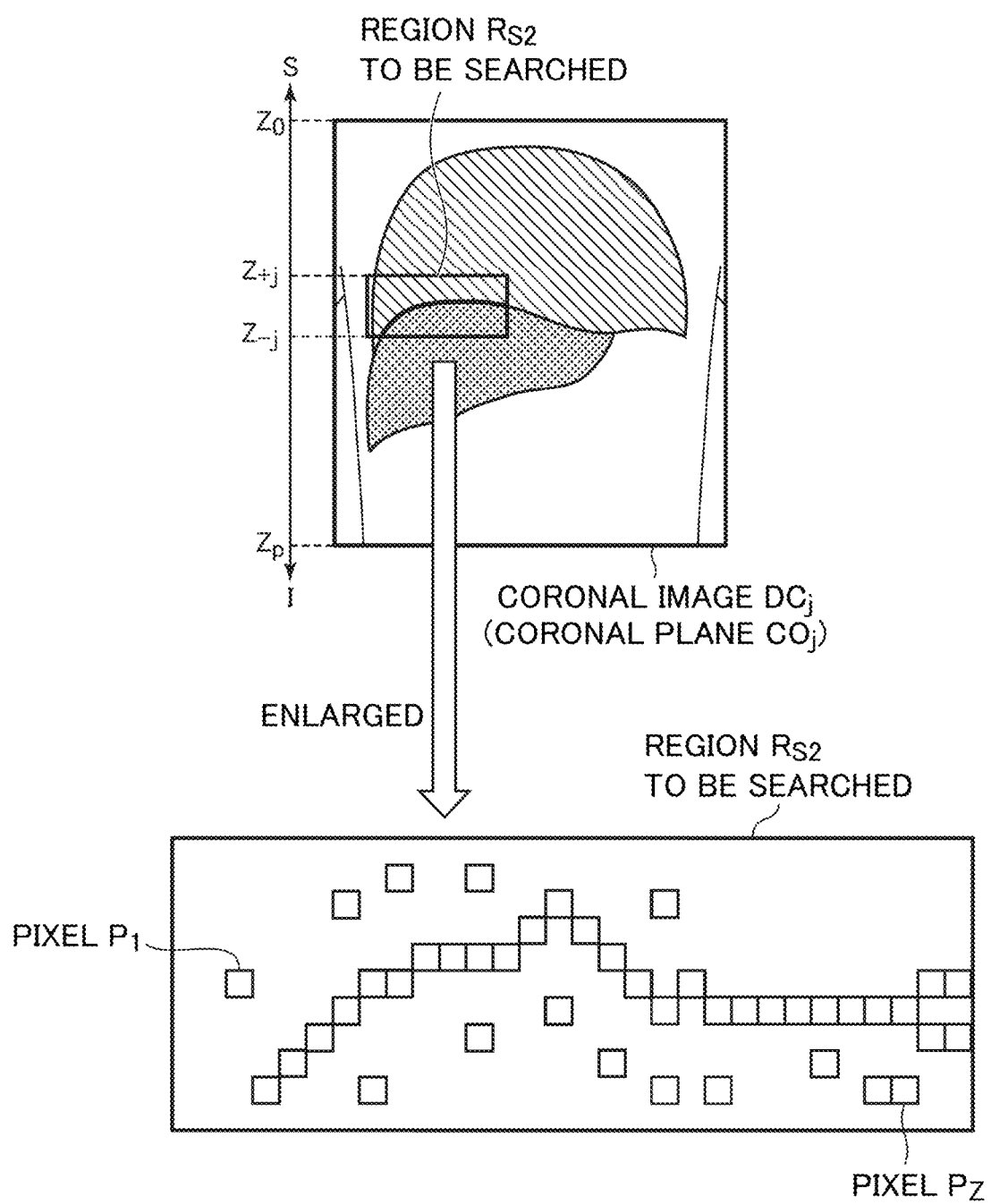
FIG. 26 is a diagram schematically showing pixels chosen as being likely to lie on the edge E of the liver from within the region Rs2 to be searched.

At Step ST92, the pixel choosing unit 9e chooses pixels supposed to be likely to lie on the edge E of the liver from among the plurality of pixels contained in the region Rs2 to be searched. The method of choosing the pixel is the same as that at Step ST82, and description thereof will be omitted. FIG. 26 schematically shows pixels P1-Pz chosen as being likely to lie on the edge E of the liver from within the region Rs2 to be searched. In FIG. 26, a differential image is omitted and a coronal image $DC_j$ is shown. The chosen pixels are represented by boxes (squares). In FIG. 26, two representative pixels from among the chosen plurality of pixels are designated by symbols "P1" and "Pz." After choosing the pixel P1 from within the region Rs2 to be searched, the flow goes to Step ST93.

Figure 27:
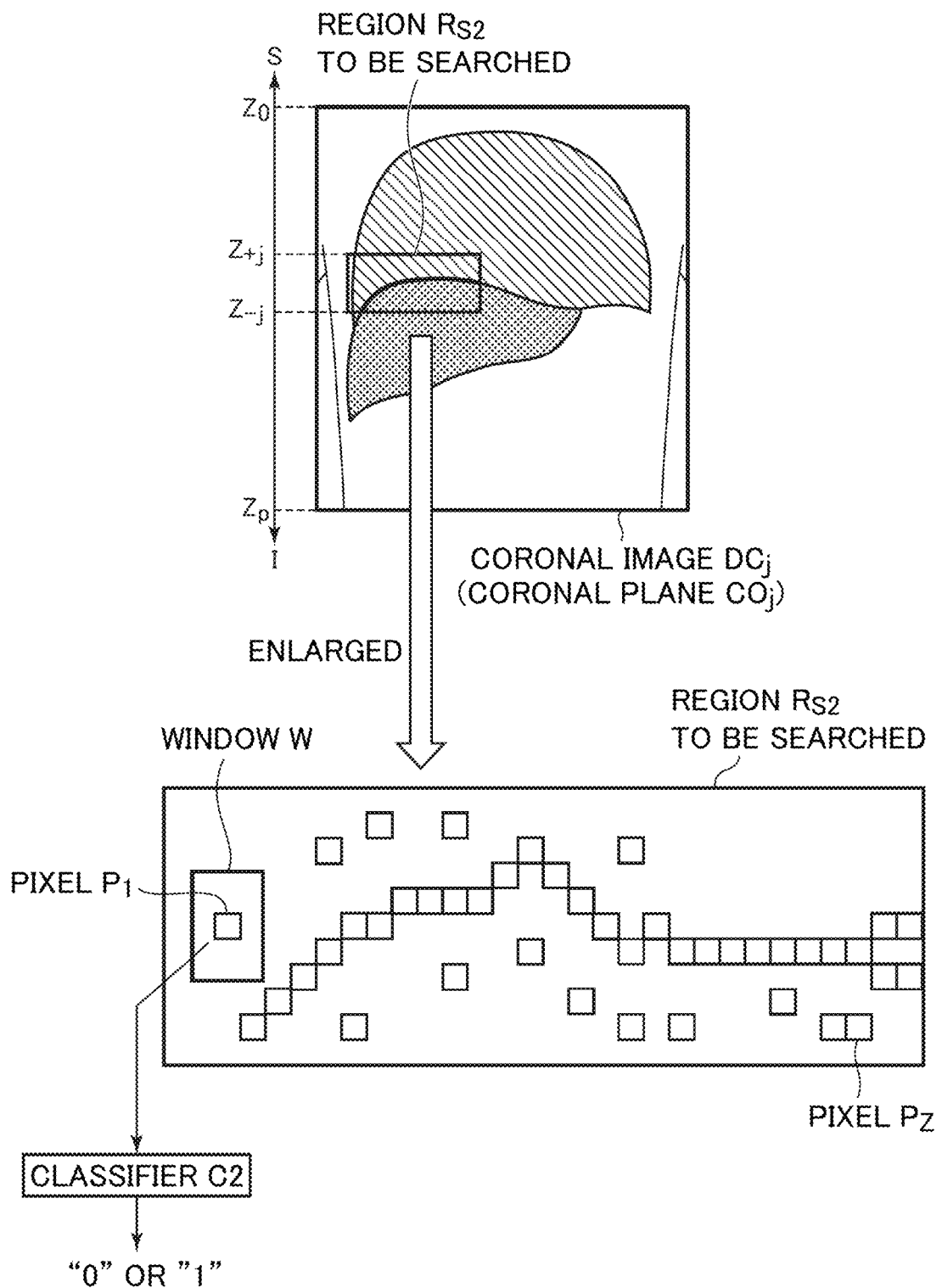
FIG. 27 is a diagram explaining a method of deciding whether a pixel lies on the edge E of the liver.

At Step ST93, the deciding unit 9j (see FIG. 2) decides whether the pixel chosen from within the region Rs2 to be searched lies on the edge E of the liver or not (see FIG. 27).

FIG. 27 is a diagram explaining the method of deciding whether a pixel lies on the edge E of the liver or not. The deciding unit 9j defines a window W for a chosen pixel. FIG. 27 shows an example in which a window W is defined for the pixel P1. The deciding unit 9j defines the window W centering at the pixel P1. The size of the window W is n×m pixels. In FIG. 27, the size of the pixel P1 is exaggerated relative to that of the window W to clearly illustrate their positional relationship.

After positioning the window W, the deciding unit 9j extracts pixel data within the window W and decides whether the pixel P1 lies on the edge of the liver or not using a classifier C2. The classifier C2 is similar to the classifier C1 (see FIG. 18), which is generated by an algorithm of machine learning by learning a large number of sets of supervised data. In this example, the classifier C2 outputs one when the pixel lies on the edge of the liver and zero when not. Thus, whether the pixel P1 lies on the edge E of the liver or not may be decided.

Figure 28:
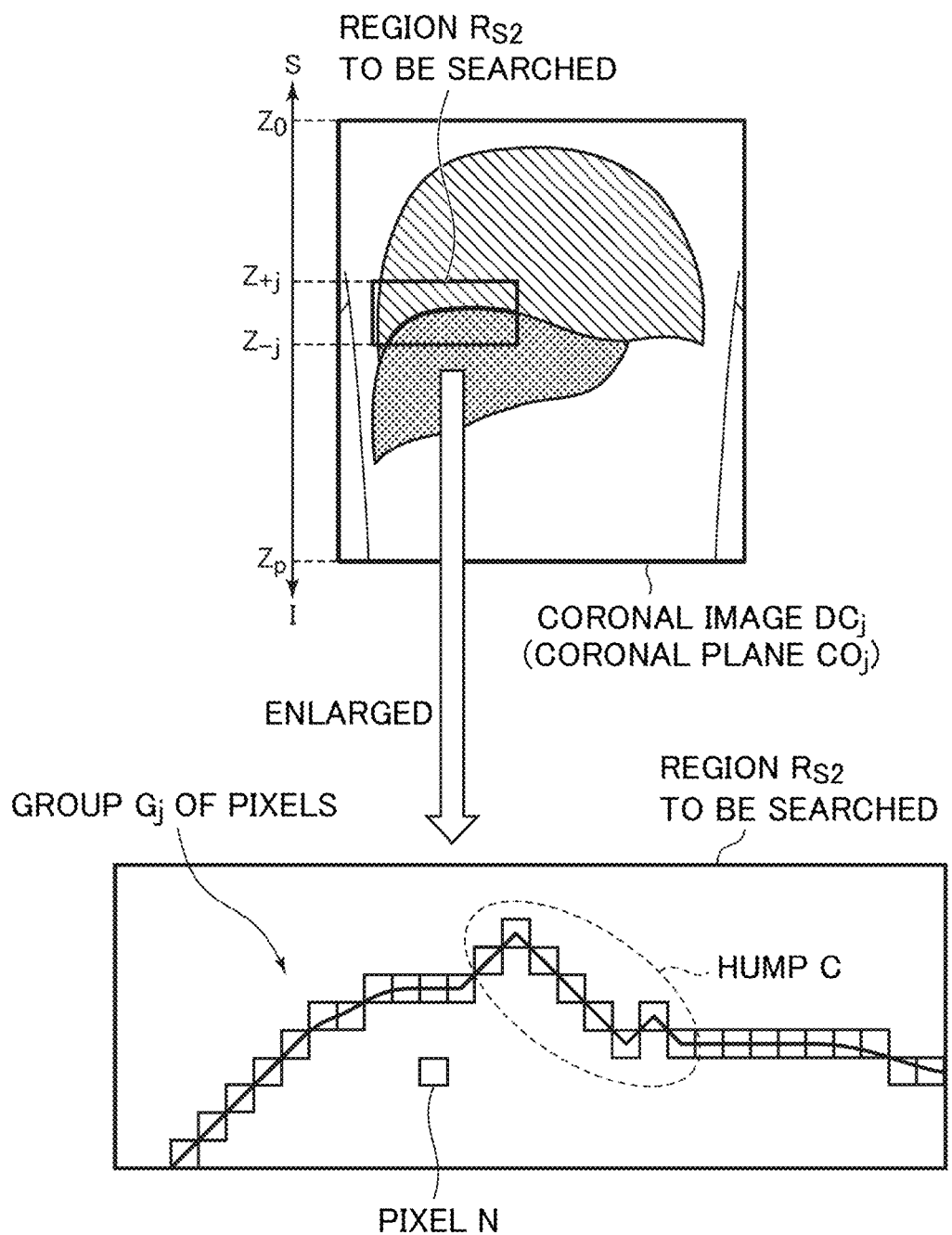
FIG. 28 is a diagram schematically showing pixels decided to lie on the edge E of the liver within the region Rs2 to be searched in the coronal plane $CO_j$.

While the method of deciding whether the pixel P1 lies on the edge E of the liver or not is illustrated in FIG. 27, the decision as to whether a pixel lies on the edge E of the liver or not is made for other pixels in a similar manner using the classifier C2. Therefore, pixels lying on the edge E of the liver may be detected from among the pixels P1-Pz in the region Rs2 to be searched. FIG. 28 schematically shows pixels decided to lie on the edge E of the liver within the region Rs2 to be searched in the coronal plane $CO_j$. In FIG. 28, a group of pixels decided to lie on the edge E of the liver are designated by symbol "Gj."

It should be noted that pixels not lying on the edge of the liver may be sometimes decided to lie on the edge E of the liver depending upon the pixel value of the pixels in the window W. FIG. 28 also shows a pixel N as an example of the pixel not lying on the edge of the liver but decided to lie on the edge E of the liver. Moreover, an artificial hump c may sometimes appear in the group Gj of pixels, which would not naturally appear in the edge of the liver. The group Gj of pixels may therefore incorrectly represent the shape of the edge E of the liver. Accordingly, in the present embodiment, fitting is applied after detecting the pixels lying on the edge E of the liver (see FIG. 29).

Figure 29:
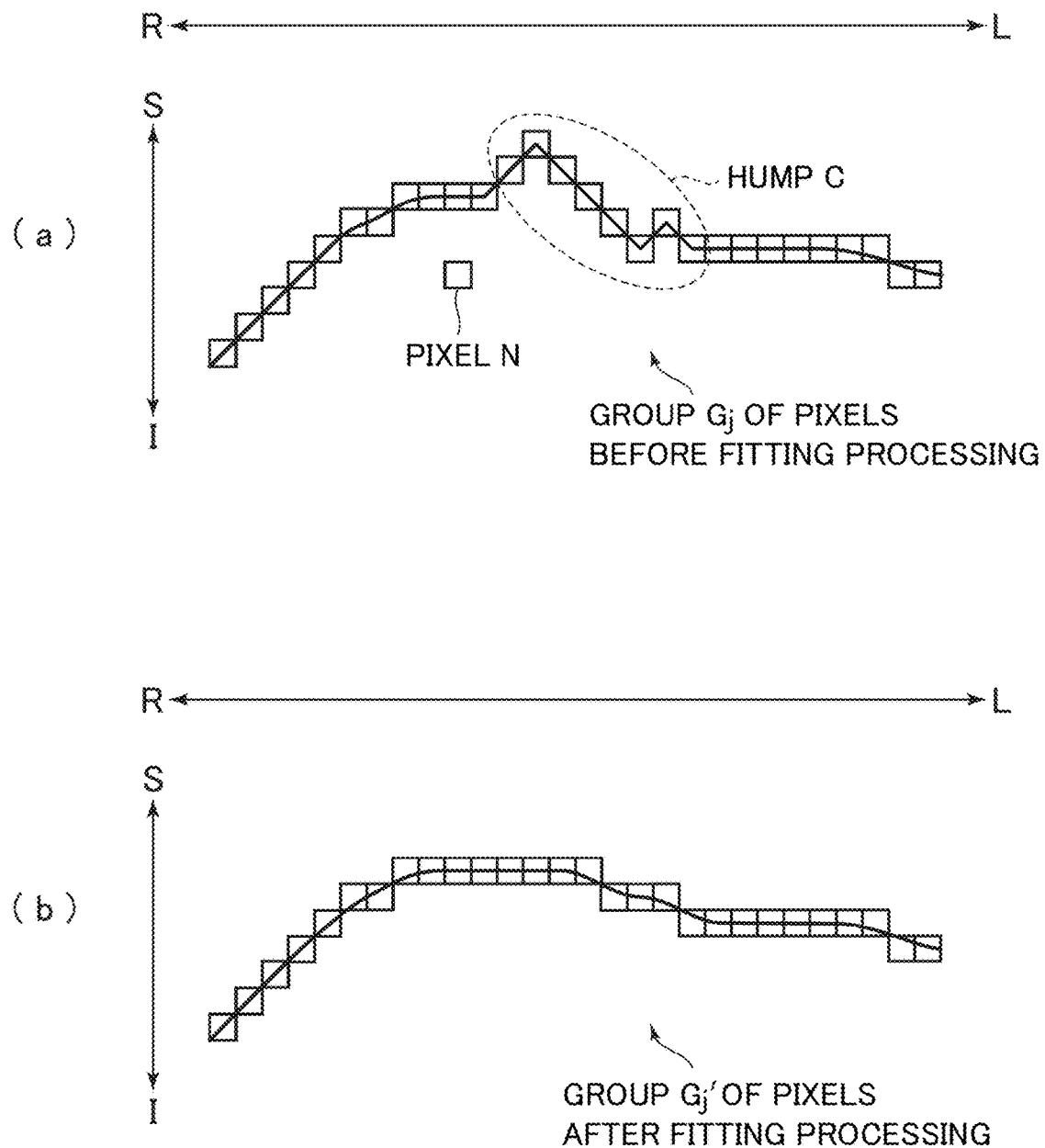
FIG. 29 is a diagram explaining fitting processing.

FIG. 29 is a diagram explaining fitting processing. FIG. 29(a) is a diagram showing a group Gj of pixels before fitting processing, and FIG. 29(b) showing a group Gj' of pixels after fitting processing.

By applying fitting processing, even when the group Gj' of pixels includes a pixel N not lying on the edge E of the liver or an artificial hump c which would not naturally appear in the edge of the liver, the position of the pixels may be corrected to fit to the edge E of the liver. The fitting may be achieved using, for example, polynomial fitting (for example, quadratic fitting). In this way, pixels lying on the edge E of the liver may be detected.

Figure 30:
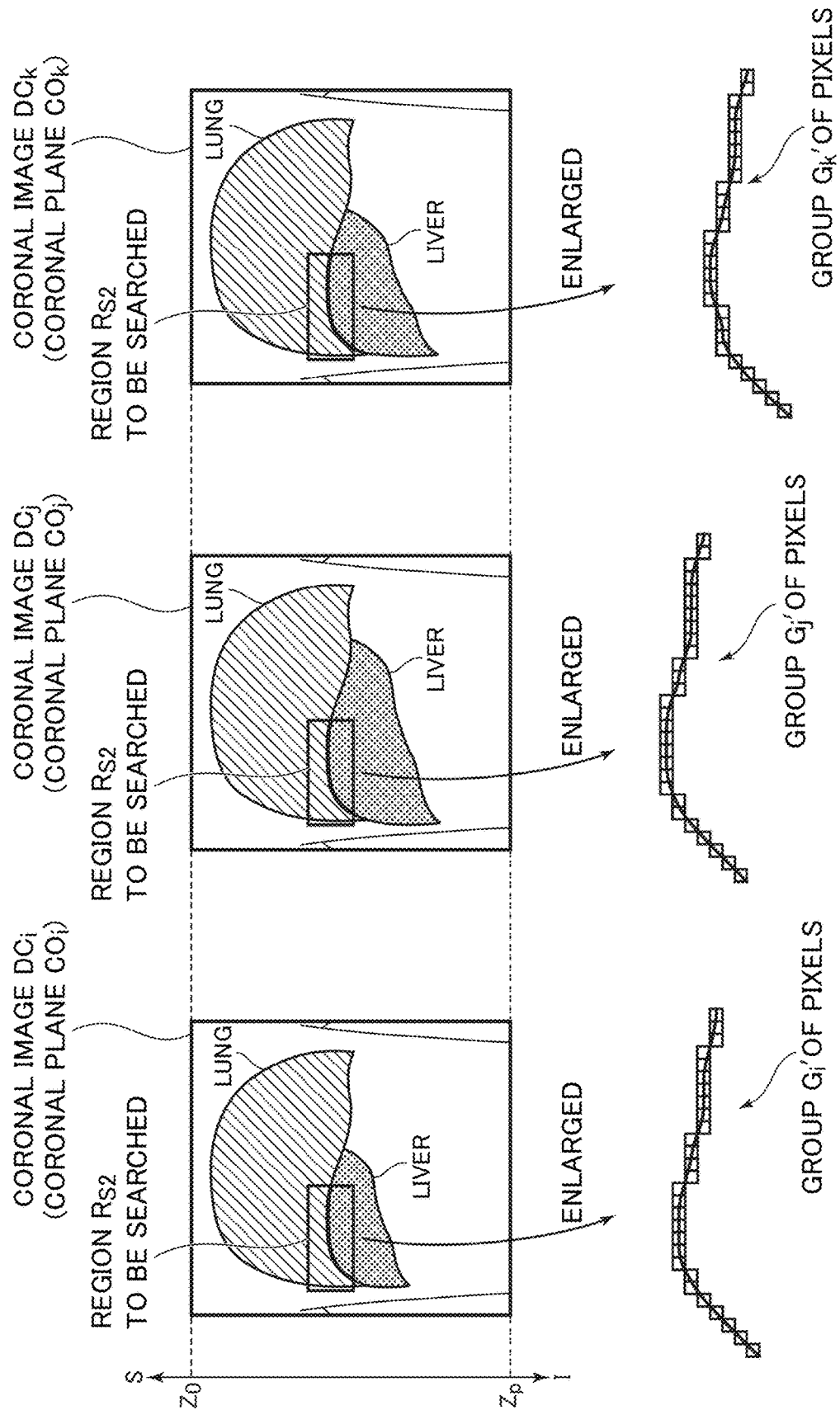
FIG. 30 is a diagram schematically showing groups Gi', Gj', Gk' of pixels.

While FIGS. 25-29 address an example of detecting the group Gj' of pixels lying on the edge E of the liver in the coronal plane $CO_j$, a group of pixels lying on the edge E of the liver may be detected for each of the other coronal planes $CO_i$ and $CO_k$ in a similar manner. FIG. 30 schematically shows groups Gi', Gj', Gk' of pixels detected respectively in the coronal planes $CO_i$, $CO_j$, and $CO_k$. After detecting the groups of pixels lying on the edge E of the liver respectively for the coronal planes, the flow goes to Step ST10.

At Step ST10, the navigator region defining unit 9*k* (see FIG. 2) defines a navigator region based on the groups Gi', Gj', Gk' of pixels. Now the method of defining a navigator region will be described.

The navigator region defining unit 9*k* first determines a pixel serving as a reference pixel in defining a navigator region. The method of determining the pixel will be described hereinbelow.

Figure 31:
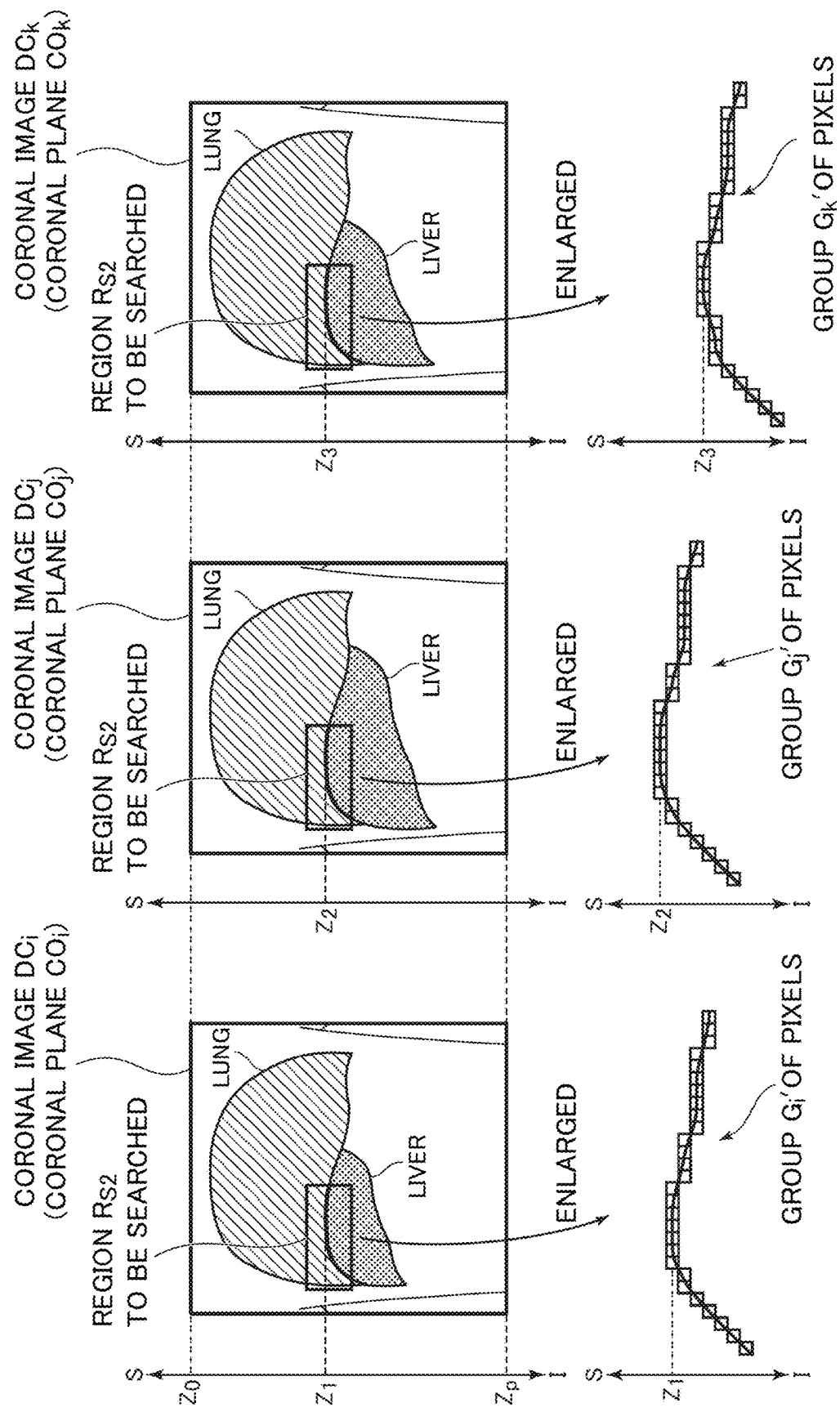
FIG. 31 is a diagram showing a coordinate value of pixels closest to z=z0 in the SI-direction.

The navigator region defining unit 9*k* determines a coordinate value of a pixel closest to z=z0 in the SI-direction for each of the groups Gi', Gj', Gk' of pixels. FIG. 31 shows coordinate values of pixels closest to z=z0 in the SI-direction. For the group Gi' of pixels, the coordinate value of a pixel closest to z=z0 in the SI-direction is z1, for the group Gj' of pixels, it is z2, and for the group Gk' of pixels, it is z3.

Next, the navigator region defining unit 9*k* identifies one of the coordinate values z1, z2, z3 that is closest to z=z0. In this example, it is assumed that z2 is closest to z=z0. Therefore, the coordinate value of the pixel closest to z=z0 in the SI-direction is determined as z=z2. FIG. 32 shows the group Gj' of pixels including the pixels at z=z2.

Figure 33:
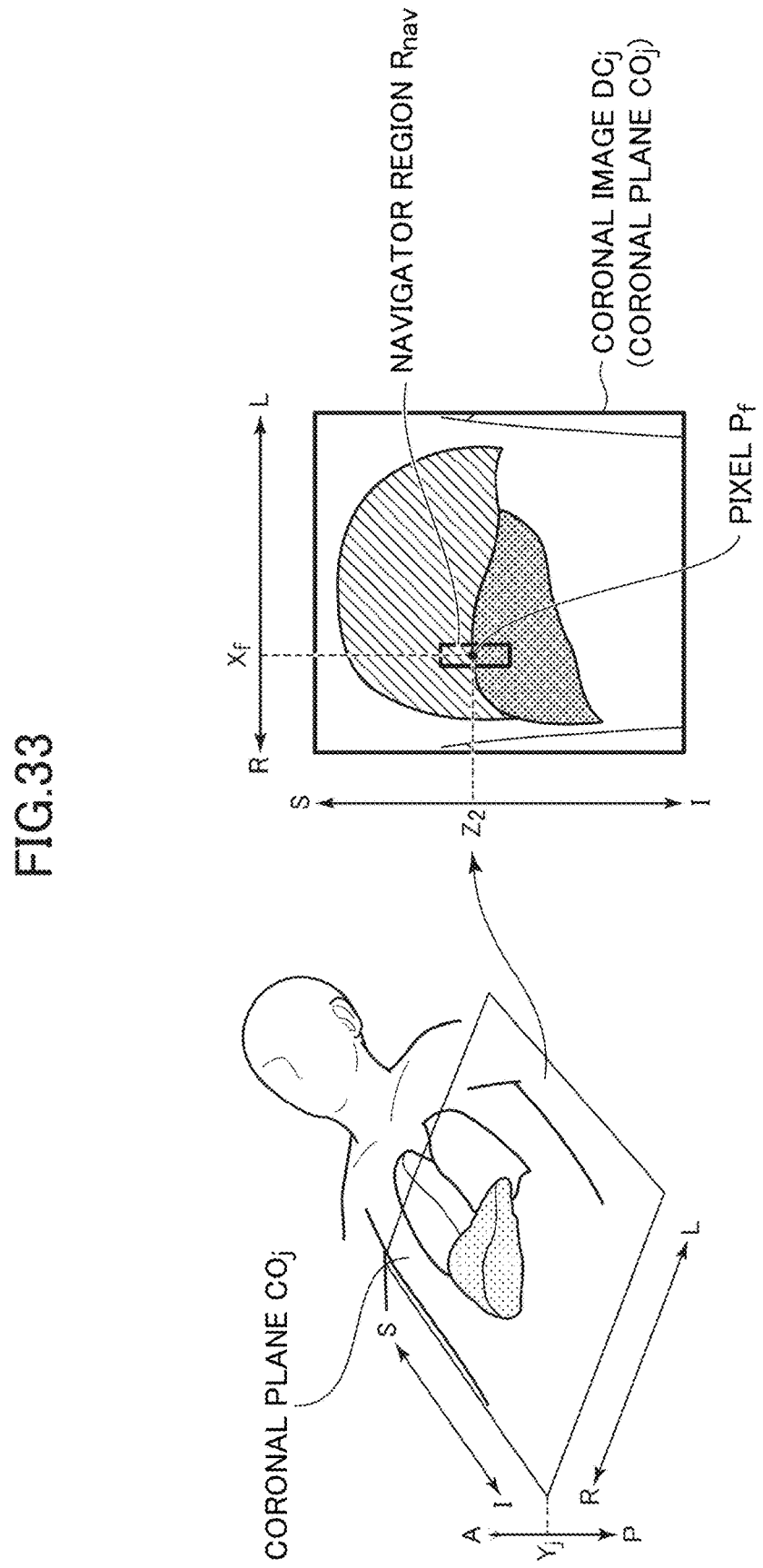
FIG. 33 is a diagram schematically showing a navigator region $R_{nav}$ positioned around a pixel $P_f$.

Referring to the group Gj' of pixels, there are a plurality of pixels having the coordinate value z=z2. In this case, the navigator region defining unit 9*k* determines one of the plurality of pixels as pixel serving as a reference pixel in positioning the navigator region. In the present embodiment, a pixel $P_f$ from among those at the coordinate value z=z2 that lies farthest to the R-side is determined as a reference pixel in positioning the navigator region. After determining the pixel $P_f$, the navigator region defining unit 9*k* defines a navigator region based on the information on the position of the pixel $P_f$. FIG. 33 schematically shows a navigator region $R_{nav}$ positioned around the pixel $P_f$. The coordinate value P of the pixel Pr in the RL-direction is $x=x_f$, and the coordinate value z thereof in the SI-direction is z=z2 (see FIG. 32). Moreover, since the pixel $x_f$ is included in the coronal plane $CO_j$, the coordinate value $y_j$ of the coronal plane $CO_j$ in the AP-direction is the coordinate value of the pixel $x_f$ in the AP-direction. The coordinate values of the pixel $x_f$ are thus determined in the three directions (RL-, SI-, and AP-directions), so that the navigator region $R_{nav}$ may be defined around the position of the pixel $P_f$. Moreover, by setting the position of the pixel $P_f$ lying farthest to the R-side as the position of the navigator region $R_{nav}$, the navigator region $R_{nav}$ may be placed away from the heart, which can also reduce degradation of respiration signals due to heartbeats. After determining the position of the navigator region $R_{nav}$, the flow goes to Step ST11.

At Step ST11, a main scan is executed. In the main scan MS, a navigator sequence for detecting motion of an uppermost end of the liver from the navigator region $R_{nav}$ and an imaging scan for acquiring imaging data of the part including the liver are performed. After completing the main scan, the flow is terminated.

According to the present embodiment, the classifier C1 is used to calculate indicators VI representing a likelihood that the pixels P1-P31 lie on the edge E of the liver. Then, based on the indicators VI, the position $z_j$ of the edge E of the liver in the SI-direction is determined. Since the position $x_j$ of the edge E of the liver in the SI-direction may be thus determined without binarizing an image using a threshold, precision of detection of the position $x_j$ of the edge E of the liver may be improved.

Moreover, according to the present embodiment, after determining the position $x_j$ of the edge E of the liver in the SI-direction, the region Rs2 to be searched for searching for pixels lying on the edge E of the liver is defined based on the position $x_j$. Since the region Rs2 to be searched may be thus defined to include the edge E of the liver without expanding the area of the region Rs2 to be searched, a time required to search for pixels lying on the edge E of the liver from within the region Rs2 to be searched may be reduced.

In the present embodiment, an example in which the region Rs1 to be searched is divided into eleven sub-regions R1-R11 (an example of the number of division DN=11) is illustrated (see FIG. 20). However, the number of division DN for the region Rs1 to be searched is not limited to DN=11 and may be determined according to the size of the region Rs1 to be searched, etc.

In the present embodiment, the pixels P1-P31 likely to lie on the edge E of the liver are chosen from within the region Rs1 to be searched (Step ST82), and the indicator VI is calculated for each of only these pixels P1-P31 (Step ST83). However, it is possible to omit Step ST82 and determine the indicator VI for all pixels contained in the region Rs1 to be searched at Step ST83. In case that the indicator VI is thus determined for all pixels contained in the region Rs1 to be searched, again, a histogram may be generated (Step ST84) to choose a sub-region R5 from among the sub-regions R1-R11 most likely to include the edge E of the liver (Step ST85). In this case, however, since the indicator VI should be determined for all pixels contained in the region Rs1 to be searched, a longer time is required at Step ST8 for determining the position of the edge E of the liver in the SI-direction. Therefore, in case that the time required for the processing at Step ST8 is desired to be reduced, Step ST82 is preferably provided to choose beforehand the pixels P1-P31 likely to lie on the edge E of the liver from within the region Rs1 to be searched.

The description of the present embodiment addresses the method of identifying the position of the edge E of the liver in the SI-direction. However, the present invention is not limited to identification of the position of the edge E of the liver in the SI-direction, and it may be applied to a case in which it is necessary to identify the position of any of various parts.

What is claimed is:

1. A magnetic resonance apparatus comprising:
   an image producing unit for producing localizer images of a subject to be imaged including a first part;
   a search-region defining unit for defining a first region to be searched including said first part;
   a unit for determining, based on pixel values of a plurality of pixels contained in said localizer images, indicators each representing a likelihood that one of said plurality of pixels included in said first region to be searched lies in said first part;
   a detecting unit for, by dividing said first region to be searched into a plurality of sub-regions arranged in a first direction intersecting said first part, detecting a position of said first part in said first direction based on said indicators obtained on a sub-region-by-sub-region basis; and
   a navigator region defining unit for defining a navigator region around said position of said first part;
   wherein the magnetic resonance apparatus performs a navigator sequence for detecting motion of said position of said first part from the navigator region and performs a main scan for acquiring imaging data of said first part.

2. The magnetic resonance apparatus as recited in claim 1, wherein:

said detecting unit chooses a first sub-region including said first part from among said plurality of sub-regions based on said indicators, and detects said position of said first part in said first direction based on a position of said first sub-region in said first direction.

3. The magnetic resonance apparatus as recited in claim 2, wherein:
said detecting unit determines a sum value of said indicators in each of said sub-regions, and chooses said first sub-region based on said sum values.

4. The magnetic resonance apparatus as recited in claim 1, wherein:
said unit for determining indicators defines a window surrounding a plurality of pixels including a pixel contained in said first region to be searched within said localizer image, and determines the corresponding indicator based on pixel values of pixels contained in said window.

5. The magnetic resonance apparatus as recited in claim 4, comprising:
a pixel choosing unit for choosing a first pixel that is likely to lie in said first part from among a plurality of pixels contained in said first region to be searched, wherein said unit for determining indicators defines said window so that said first pixel is contained in said window.

6. The magnetic resonance apparatus as recited in claim 5, wherein:
said image producing unit produces a differential image for each said localizer image, and
said pixel choosing unit chooses said first pixel based on said differential image.

7. The magnetic resonance apparatus as recited in claim 5, wherein:
said search-region defining unit defines a second region to be searched based on said position of said first part in said first direction, and
said pixel choosing unit chooses a pixel that is likely to lie in said first part from within said second region to be searched.

8. The magnetic resonance apparatus as recited in claim 7, comprising:
a deciding unit for deciding whether a pixel chosen from within said second region to be searched lies in said first part or not.

9. The magnetic resonance apparatus as recited in claim 1, wherein:
said unit for determining indicators determines said indicators using a classifier.

10. The magnetic resonance apparatus as recited in claim 1, wherein:
said first part includes an edge of a liver adjacent to lungs.

11. A method of magnetic resonance imaging, the method comprising:
producing localizer images of a subject to be imaged including a first part;
defining a first region to be searched including the first part;
determining, based on pixel values of a plurality of pixels contained in the localizer images, indicators each representing a likelihood that one of the plurality of pixels included in the first region to be searched lies in the first part;
dividing the first region to be searched into a plurality of sub-regions arranged in a first direction intersecting the first part;
detecting a position of the first part in the first direction based on the indicators obtained on a sub-region-by-sub-region basis;
defining a navigator region around the position of the first part;
performing a navigator sequence for detecting motion of the position of the first part from the navigator region; and
performing a main scan for acquiring imaging data of the first part.

12. The method of claim 11, wherein detecting the position of the first part comprises:
determining a sum value of the indicators in each of the sub-regions;
choosing a first sub-region of the maximum sum value; and
detecting the position of the first part in the first direction based on a position of the first sub-region in the first direction.

13. The method of claim 11, wherein determining indicators comprises:
defining a window surrounding a plurality of pixels including a pixel contained in the first region to be searched within the localizer image; and
determining the corresponding indicator based on pixel values of pixels contained in said window.

14. The method of claim 13, further comprising:
producing a differential image for each localizer image;
choosing a first pixel that is likely to lie in the first part from among a plurality of pixels contained in the first region to be searched based on the differential image.

15. The method of claim 13, wherein the first part includes an edge of a liver adjacent to lungs.

* * * * *